(12) United States Patent
Shinya et al.

(10) Patent No.: US 8,375,268 B2
(45) Date of Patent: Feb. 12, 2013

(54) RECEIVING APPARATUS, RECEIVING METHOD, COMPUTER PROGRAM, AND RECEIVING SYSTEM

(75) Inventors: Osamu Shinya, Kanagawa (JP); Takashi Yokokawa, Kanagawa (JP); Naoki Yoshimochi, Kanagawa (JP)

(73) Assignee: Sony Corporation, Tokyo (JP)

( * ) Notice: Subject to any disclaimer, the term of this patent is extended or adjusted under 35 U.S.C. 154(b) by 224 days.

(21) Appl. No.: 12/888,071

(22) Filed: Sep. 22, 2010

(65) Prior Publication Data
US 2011/0099453 A1  Apr. 28, 2011

(30) Foreign Application Priority Data

Oct. 28, 2009 (JP) ................................. 2009-247757

(51) Int. Cl.
*H03M 13/00* (2006.01)
(52) U.S. Cl. ........................................ 714/755; 714/786
(58) Field of Classification Search .................. 714/755, 714/786
See application file for complete search history.

(56) References Cited

U.S. PATENT DOCUMENTS
6,597,741 B1 * 7/2003 Miyazaki .................. 375/240.25

OTHER PUBLICATIONS
"Digital Video Broadcasting (DVB); Frame structure channel coding and modulation for a second generation digital terrestrial television broadcasting system (DVB-T2)." DVB Document A122. Digital Video Broadcasting. Jun. 2010. 179 pages.
U.S. Appl. No. 13/242,754, filed Sep. 23, 2011, Yoshimochi, et al.
U.S. Appl. No. 13/235,816, filed Sep. 19, 2011, Yoshimochi, et al.
U.S. Appl. No. 13/235,864, filed Sep. 19, 2011, Yoshimochi, et al.

* cited by examiner

*Primary Examiner* — Guy Lamarre
(74) *Attorney, Agent, or Firm* — Oblon, Spivak, McClelland, Maier & Neustadt, L.L.P.

(57) ABSTRACT

A receiving apparatus includes: a first decoding means for performing, every time frame data in which an inner code and an outer code are used as error correction codes is transmitted thereto, decoding processing employing the inner code and outputting decoded data; a storing means for storing the decoded data; a second decoding means for applying decoding processing employing the outer code to the decoded data; and a control means for controlling storage and output of the decoded data in and from the storing means to suspend, while the control means causes the storing means to output first decoded data as the decoded data of a decoding result of first frame data to the second decoding means, when the first decoding means starts output of second decoded data as the decoded data of a decoding result of second frame data following the first frame data, the output of the first decoded data to the second decoding means and cause the storing means to store the second decoded data and, when the storage of the second decoded data ends, cause the storing means to resume the output of the first decoded data to the second decoding means.

15 Claims, 17 Drawing Sheets

FIG.2A

PARAMETERS OF NORMAL FRAME

| LDPC CODE RATE | LDPC CODE LENGTH | BCH CODE LENGTH |
|---|---|---|
| 1/2 | 64800 | 32400 |
| 3/5 | 64800 | 38880 |
| 2/3 | 64800 | 43200 |
| 3/4 | 64800 | 48600 |
| 4/5 | 64800 | 51840 |
| 5/6 | 64800 | 54000 |

FIG.2B

PARAMETERS OF SHORT FRAME

| LDPC CODE RATE | LDPC CODE LENGTH | BCH CODE LENGTH |
|---|---|---|
| 1/2 | 16200 | 7200 |
| 3/5 | 16200 | 9720 |
| 2/3 | 16200 | 10800 |
| 3/4 | 16200 | 11880 |
| 4/5 | 16200 | 12600 |
| 5/6 | 16200 | 13320 |

CONTROL SIGNAL BUFFER 22

$A_{11}$  $A_{12}$  $A_{13}$  $A_{14}$

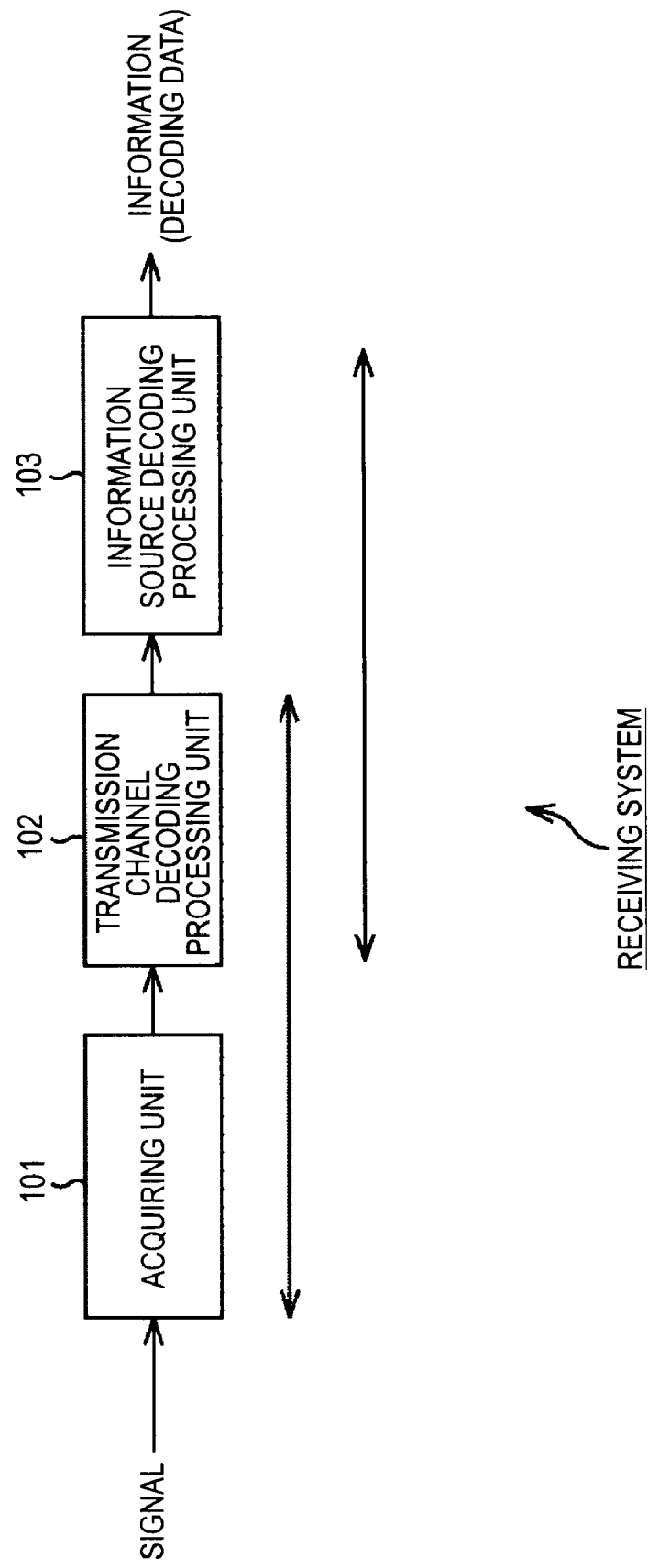

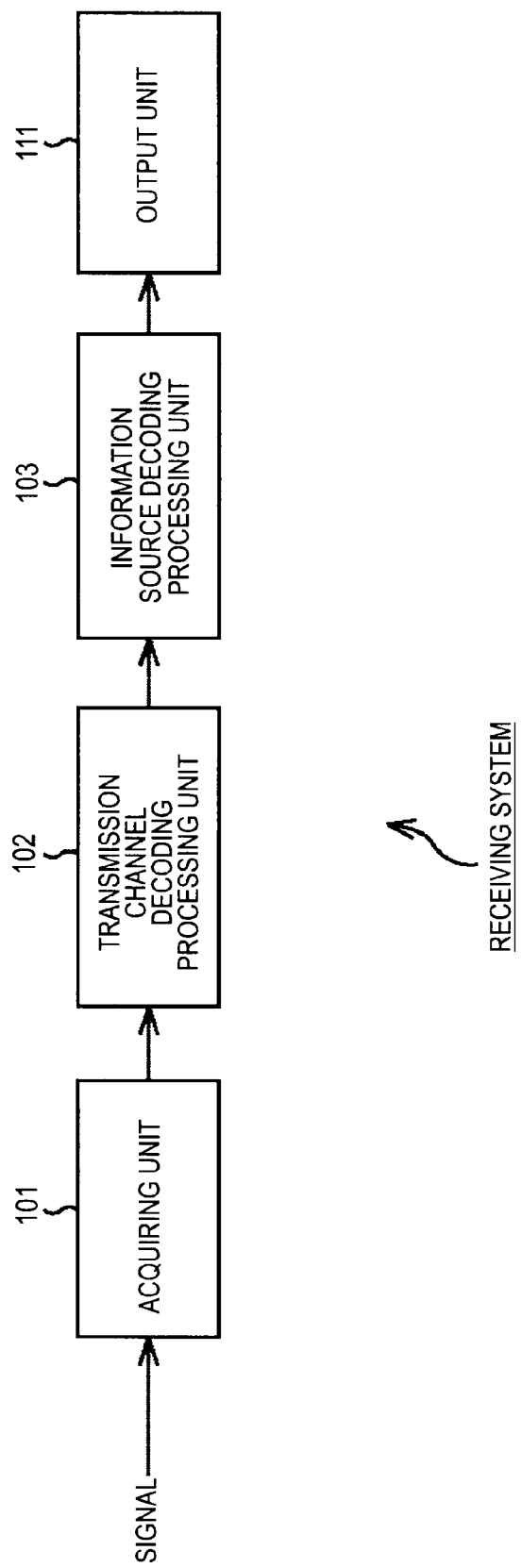

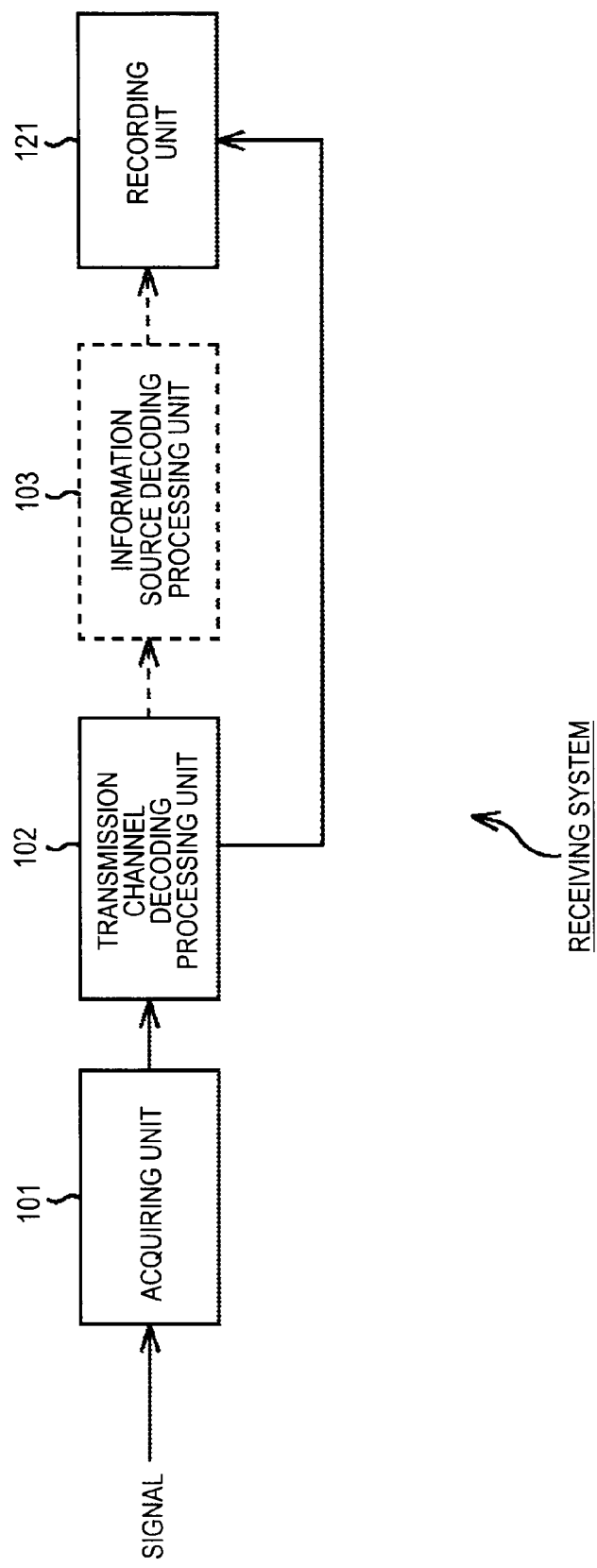

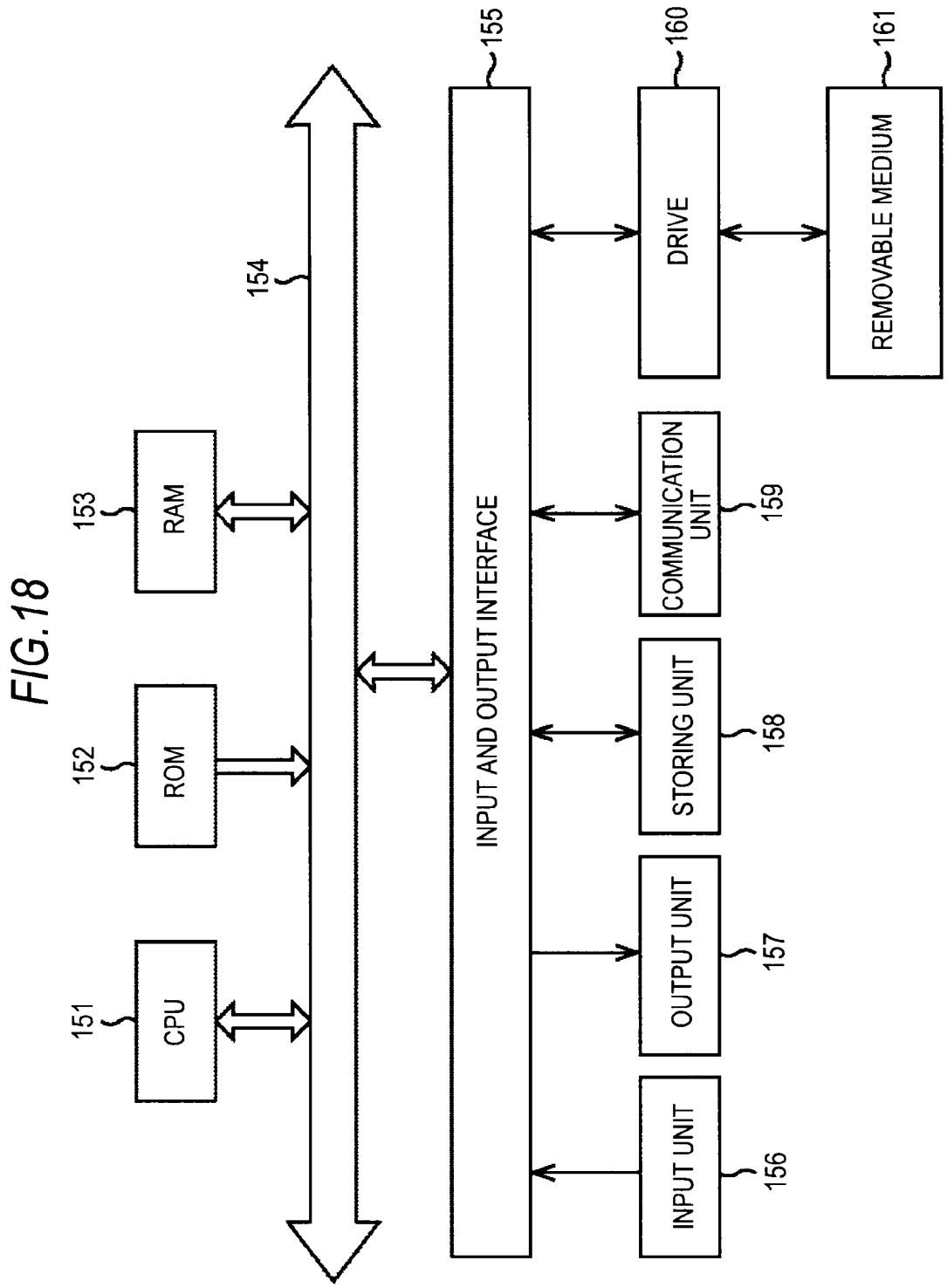

RECEIVING APPARATUS, RECEIVING METHOD, COMPUTER PROGRAM, AND RECEIVING SYSTEM

BACKGROUND OF THE INVENTION

1. Field of the Invention

The present invention relates to a receiving apparatus, a receiving method, a computer program, and a receiving system, and, more particularly to a receiving apparatus, a receiving method, a computer program, and a receiving system that make it possible to prevent a loss of data when frame data in which an inner code and an outer code are used as error correction codes is decoded.

2. Description of the Related Art

As a standard of the terrestrial digital broadcast, there is the DVB-T2 standard (the Second-Generation European Terrestrial Digital Broadcast Standard). The DVB-T2 standard is described in a so-called BlueBook (DVB BlueBook A122) (DVB BlueBook A122 Rev. 1, Frame structure channel coding and modulation for a second generation digital terrestrial television broadcasting system (DVB-T2), Sep. 1, 2008, Web Page of DVB, [retrieved on Aug. 5, 2009], Internet <URL: http://www.dvb.org/technology/standards/>).

In a transmission system of the DVB-T2 standard, a concatenated code of an inner code and an outer code is used as an error correction code. In the DVB-T2 standard, an LDPC code is used as the inner code and a BCH code is used as the outer code.

An apparatus on a reception side first applies LDPC decoding processing to received data to be decoded and, thereafter, applies BCH decoding processing to the data. The apparatus once stores data of a result of the LDPC decoding processing in a buffer and applies the BCH decoding processing to the data stored in the buffer. The buffer in which the data obtained as a result of the LDPC decoding processing is stored is hereinafter referred to as LDPC output buffer as appropriate.

SUMMARY OF THE INVENTION

FIG. 1 is a diagram of a structure example of a code frame (FECFRAME) specified by the DVB-T2 standard.

As shown in FIG. 1, one code frame includes BBFRAME, BCHFEC, and LDPCFEC. In the DVB-T2 standard, as code frames having such a structure, a Normal frame and a Short frame having different frame lengths are specified.

FIGS. 2A and 2B are diagrams of encoding parameters of the Normal frame and the Short frame. The encoding parameters shown in FIGS. 2A and 2B are the same as those described in the standard V1.2.0c Table 5(a), (b).

As shown in FIG. 2A, concerning the Normal frame, for example, when an LDPC code rate is 1/2, LDPC code length is 64800 bits and BCH code length is 32400 bits. The LDPC code length is equivalent to the length of BBFRAME, BCHFEC, and LDPCFEC as shown in FIG. 1. The BCH code length is equivalent to the length of BBFRAME and BCHFEC as shown in FIG. 1.

As shown in FIG. 2B, concerning the Short frame, for example, when the LDPC code rate is 1/2, the LDPC code length is 16200 bits and the BCH code length is 7200 bits.

As a capacity of the LDPC output buffer, at least 54000 bits as a maximum data amount likely to be stored in the LDPC output buffer is secured. When the LDPC code rate of the Normal frame is 5/6, the BCH code length is 54000 bits, which is the maximum data amount likely to be stored in the LDPC output buffer.

Such a Normal frame or a Short frame is sequentially input to an error-correction processing unit of the receiving apparatus. The Normal frame and the Short frame are frequently switched. Parameters of the code frames are complicatedly transmitted. Therefore, for example, the code length of a BCH code input to a BCH code decoder also frequently changes. This means that time necessary for BCH decoding processing frequently changes.

FIG. 3 is a diagram of an example of input timing of code frames.

Time $t_1$ in FIG. 3 represents timing when data of a decoding result of a first Normal frame is output from a LDPC code decoder to the LDPC output buffer. Time $t_2$ represents timing when data of a decoding result of a second Normal frame is output from the LDPC code decoder to the LDPC output buffer.

Time $t_3$ represents timing when data of a decoding result of a first Short frame input following the second Normal frame is output from the LDPC code decoder to the LDPC output buffer. Time $t_4$ and subsequent times respectively represent timings when data of decoding results of second and subsequent Short frames are output from the LDPC code decoder to the LDPC output buffer.

Time necessary for output of data of an LDPC decoding result is substantially proportional to a data amount of a code frame to be subjected to LDPC decoding processing. For example, time from time $t_1$ to time $t_2$ is time necessary for output of data of an LDPC decoding result of the first Normal frame. Time from time $t_3$ to time $t_4$ is time necessary for output of data of an LDPC decoding result of the first Short frame.

Therefore, as shown in FIG. 3, when a code frame to be input is switched from a Normal frame to a Short frame, situations explained below occur because a frame interval of the Short frame is short compared with a frame interval of the Normal frame.

Situation 1

While data of a Normal frame is output from the LDPC output buffer to the BCH code decoder, when data of the next Short frame is output from the LDPC code decoder to the LDPC output buffer, a loss of the frames occur because of overwrite of a control signal.

Control signals including parameters used for decoding of code frames are added to the code frames as attribute information. The control signals are output from the LDPC code decoder to the LDPC output buffer together with data of the code frames and stored in the LDPC output buffer. For example, when a control signal for a Normal frame stored in the LDPC output buffer is overwritten with data of the next Short frame output from the LDPC code decoder, it is difficult to perform the BCH decoding or the like of the Normal frame and a loss of the frames occur.

Situation 2

When, although output of data of a Normal frame from the LDPC output buffer to the BCH code decoder is completed, data of plural Short frames are continuously output from the LDPC code decoder to the LDPC output buffer during BCH decoding processing for the Normal frame, a loss of the frames occurs because of overwrite of the data of the Short frame and a control signal.

It is conceivable to prepare an LDPC output buffer having a large capacity or prepare plural LDPC output buffers in order to prevent such a loss of frames. However, this is disadvantageous in terms of cost.

Therefore, it is desirable to make it possible to prevent a loss of data when frame data in which an inner code and an outer code are used as error correction codes is decoded.

According to an embodiment of the present invention, there is provided a receiving apparatus including: a first decoding means for performing, every time frame data in which an inner code and an outer code are used as error correction codes is transmitted thereto, decoding processing employing the inner code and outputting decoded data; a storing means for storing the decoded data; a second decoding means for applying decoding processing employing the outer code to the decoded data output from the storing means; and a control means for controlling storage of the decoded data in the storing means and output of the decoded data from the storing means to suspend, while the control means causes the storing means to output first decoded data as the decoded data of a decoding result of first frame data to the second decoding means, when the first decoding means starts output of second decoded data as the decoded data of a decoding result of second frame data transmitted following the first frame data, the output of the first decoded data to the second decoding means and cause the storing means to store the second decoded data and, when the storage of the second decoded data ends, cause the storing means to resume the output of the first decoded data to the second decoding means.

The frame data can be data of a Normal frame or data of a Short frame specified in DVB-T2.

Four storage areas in which the decoded data of a decoding result of data of a singularity of the Normal frame can be stored over the plural areas or the decoded data of a decoding result of data of a singularity of the Short frame can be stored in each of the areas can be provided in the storing means.

The first frame data can be the data of the Normal frame and the second frame data can be the data of the Short frame. In this case, while the control means causes the storing means to output the first decoded data to the second decoding means, when the first decoding means starts the output of the second decoded data, the control means can cause a singularity of the storage area, in which the first decoded data finished to be output is stored, to store the second decoded data.

According to the embodiment, there is also provided a receiving method for a receiving apparatus including a first decoding means for performing, every time frame data in which an inner code and an outer code are used as error correction codes is transmitted thereto, decoding processing employing the inner code and outputting decoded data, a storing means for storing the decoded data, and a second decoding means for applying decoding processing employing the outer code to the decoded data output from the storing means, the receiving method including the step of: controlling storage of the decoded data in the storing means and output of the decoded data from the storing means to suspend, while causing the storing means to output first decoded data as the decoded data of a decoding result of first frame data to the second decoding means, when the first decoding means starts output of second decoded data as the decoded data of a decoding result of second frame data transmitted following the first frame data, the output of the first decoded data to the second decoding means and cause the storing means to store the second decoded data and, when the storage of the second decoded data ends, cause the storing means to resume the output of the first decoded data to the second decoding means.

According to the embodiment, there is also provided a computer program for causing a computer to execute processing for a receiving apparatus including a first decoding means for performing, every time frame data in which an inner code and an outer code are used as error correction codes is transmitted thereto, decoding processing employing the inner code and outputting decoded data, a storing means for storing the decoded data, and a second decoding means for applying decoding processing employing the outer code to the decoded data output from the storing means, the computer program causing the computer to execute processing including the step of: controlling storage of the decoded data in the storing means and output of the decoded data from the storing means to suspend, while causing the storing means to output first decoded data as the decoded data of a decoding result of first frame data to the second decoding means, when the first decoding means starts output of second decoded data as the decoded data of a decoding result of second frame data transmitted following the first frame data, the output of the first decoded data to the second decoding means and cause the storing means to store the second decoded data and, when the storage of the second decoded data ends, cause the storing means to resume the output of the first decoded data to the second decoding means.

According to another embodiment of the present invention, there is provided a receiving system including: an acquiring means for acquiring a signal transmitted via a transmission channel; and a transmission channel decoding processing means for applying processing including error correction processing to the signal acquired by the acquiring means, wherein the transmission channel decoding processing means includes a first decoding means for performing, every time frame data in which an inner code and an outer code are used as error correction codes is transmitted thereto, decoding processing employing the inner code and outputting decoded data, a storing means for storing the decoded data, a second decoding means for applying decoding processing employing the outer code to the decoded data output from the storing means, and a control means for controlling storage of the decoded data in the storing means and output of the decoded data from the storing means to suspend, while the control means causes the storing means to output first decoded data as the decoded data of a decoding result of first frame data to the second decoding means, when the first decoding means starts output of second decoded data as the decoded data of a decoding result of second frame data transmitted following the first frame data, the output of the first decoded data to the second decoding means and cause the storing means to store the second decoded data and, when the storage of the second decoded data ends, cause the storing means to resume the output of the first decoded data to the second decoding means.

According to still another embodiment of the present invention, there is provided a receiving system including: a transmission channel decoding processing means for applying processing including error correction processing to a signal acquired via a transmission channel; and an information source decoding processing means for applying processing for decoding transmission target data to the signal processed by the transmission channel decoding processing means, wherein the transmission channel decoding processing means includes a first decoding means for performing, every time frame data in which an inner code and an outer code are used as error correction codes is transmitted thereto, decoding processing employing the inner code and outputting decoded data, a storing means for storing the decoded data, a second decoding means for applying decoding processing employing the outer code to the decoded data output from the storing means, and a control means for controlling storage of the decoded data in the storing means and output of the decoded data from the storing means to suspend, while the control means causes the storing means to output first decoded data as the decoded data of a decoding result of first frame data to the second decoding means, when the first decoding means starts output of second decoded data as the decoded data of a decoding result of second frame data transmitted following the first frame data, the output of the first decoded data to the second decoding means and cause the storing means to store the second decoded data and, when the storage of the second decoded data ends, cause the storing means to resume the output of the first decoded data to the second decoding means.

According to yet another embodiment of the present invention, there is provided a receiving system including: a transmission channel decoding processing means for applying processing including error correction processing to a signal acquired via a transmission channel; and an output means for outputting an image or sound on the basis of the signal processed by the transmission channel decoding processing means, wherein the transmission channel decoding processing means includes a first decoding means for performing, every time frame data in which an inner code and an outer code are used as error correction codes is transmitted thereto, decoding processing employing the inner code and outputting decoded data, a storing means for storing the decoded data, a second decoding means for applying decoding processing employing the outer code to the decoded data output from the storing means, and a control means for controlling storage of the decoded data in the storing means and output of the decoded data from the storing means to suspend, while the control means causes the storing means to output first decoded data as the decoded data of a decoding result of first frame data to the second decoding means, when the first decoding means starts output of second decoded data as the decoded data of a decoding result of second frame data transmitted following the first frame data, the output of the first decoded data to the second decoding means and cause the storing means to store the second decoded data and, when the storage of the second decoded data ends, cause the storing means to resume the output of the first decoded data to the second decoding means.

According to still yet another embodiment of the present invention, there is provided a receiving system including: a transmission channel decoding processing means for applying processing including error correction processing to a signal acquired via a transmission channel; and a recording means for recording the signal processed by the transmission channel decoding processing means, wherein the transmission channel decoding processing means includes a first decoding means for performing, every time frame data in which an inner code and an outer code are used as error correction codes is transmitted thereto, decoding processing employing the inner code and outputting decoded data, a storing means for storing the decoded data, a second decoding means for applying decoding processing employing the outer code to the decoded data output from the storing means, and a control means for controlling storage of the decoded data in the storing means and output of the decoded data from the storing means to suspend, while the control means causes the storing means to output first decoded data as the decoded data of a decoding result of first frame data to the second decoding means, when the first decoding means starts output of second decoded data as the decoded data of a decoding result of second frame data transmitted following the first frame data, the output of the first decoded data to the second decoding means and cause the storing means to store the second decoded data and, when the storage of the second decoded data ends, cause the storing means to resume the output of the first decoded data to the second decoding means.

In the embodiments of the present invention, the control means controls storage of the decoded data in the storing means and output of the decoded data from the storing means to suspend, while the control means causes the storing means to output first decoded data as the decoded data of a decoding result of first frame data to the second decoding means, when the first decoding means starts output of second decoded data as the decoded data of a decoding result of second frame data transmitted following the first frame data, the output of the first decoded data to the second decoding means and cause the storing means to store the second decoded data and, when the storage of the second decoded data ends, cause the storing means to resume the output of the first decoded data to the second decoding means.

According to the embodiments of the present invention, it is possible to prevent a loss of data when frame data in which an inner code and an outer code are used as error correction codes is decoded.

BRIEF DESCRIPTION OF THE DRAWINGS

FIGS. 2A and 2B are diagrams of encoding parameters for a Normal frame and a Short frame;

FIG. 15 is a block diagram of a configuration example a first embodiment of a receiving system;

FIG. 16 is a block diagram of a configuration example of a second embodiment of the receiving system;

FIG. 17 is a block diagram of a configuration example of a third embodiment of the receiving system; and FIG. 18 is a block diagram of a configuration example of a fourth embodiment of the receiving system.

DESCRIPTION OF THE PREFERRED EMBODIMENTS

[Configuration Example of an Error Correction Processing Unit]

Figure 4:
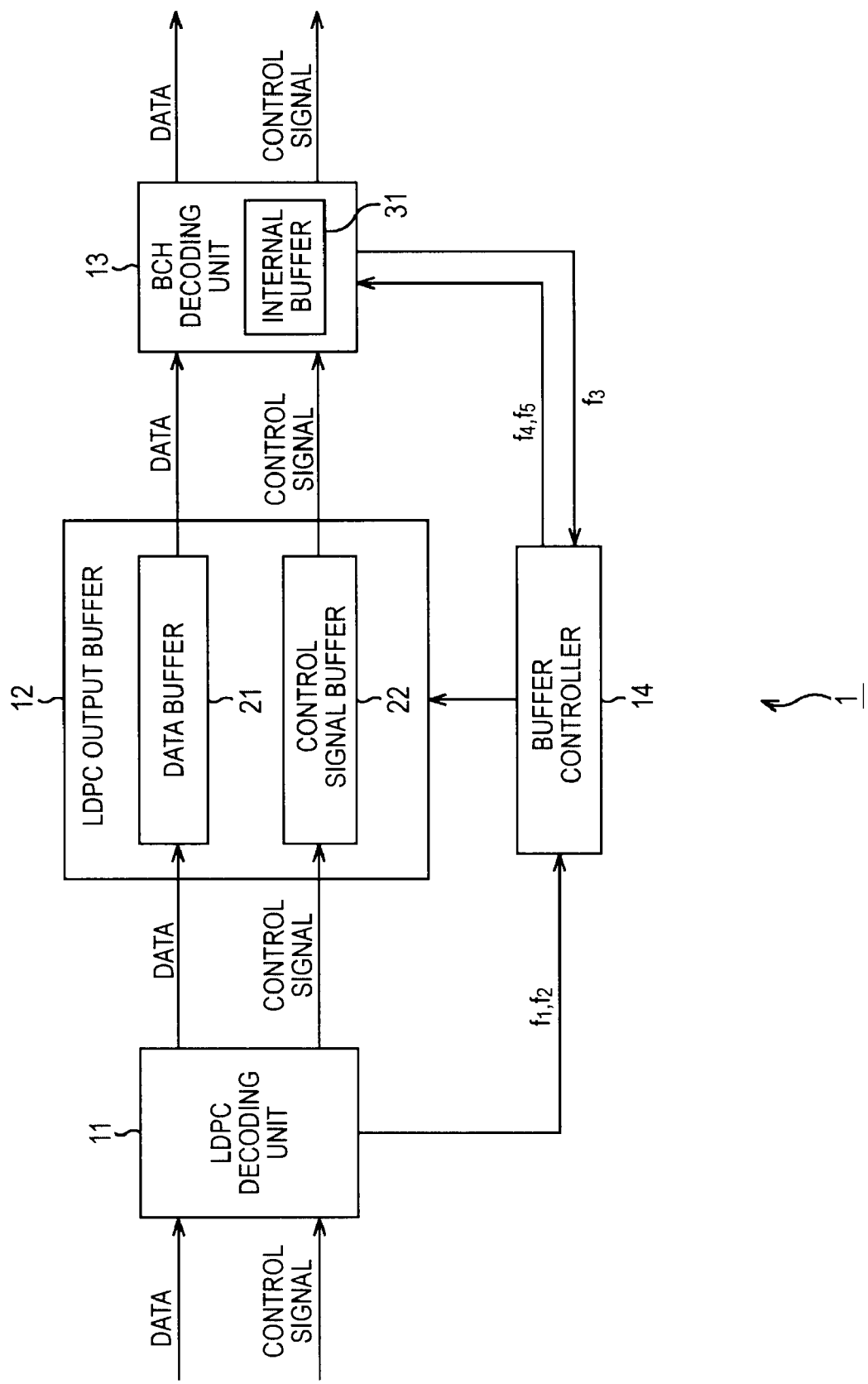
FIG. 4 is a block diagram of a configuration example of an error correction processing unit provided in a receiving apparatus according to an embodiment of the present invention.

FIG. 4 is a block diagram of a configuration example of an error correction processing unit 1 provided in a receiving apparatus according to an embodiment of the present invention.

As shown in FIG. 4, the error correction processing unit 1 includes an LDPC decoding unit 11, an LDPC output buffer 12, a BCH decoding unit 13, and a buffer controller 14. The receiving apparatus including the error correction processing unit 1 is, for example, a receiving apparatus for a broadcast wave of the DVB-T2 standard. An A/D conversion circuit that converts a reception signal into digital data, a demodulation circuit that performs demodulation processing and equalization processing, and the like are provided at a pre-stage of the error correction processing unit 1.

Figure 1:
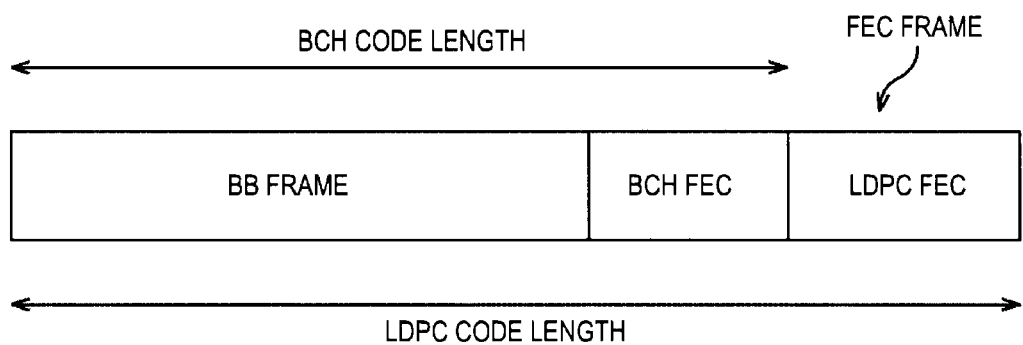
FIG. 1 is a diagram of a structure example of a code frame specified by the DVB-T2 standard.
Figure 3:
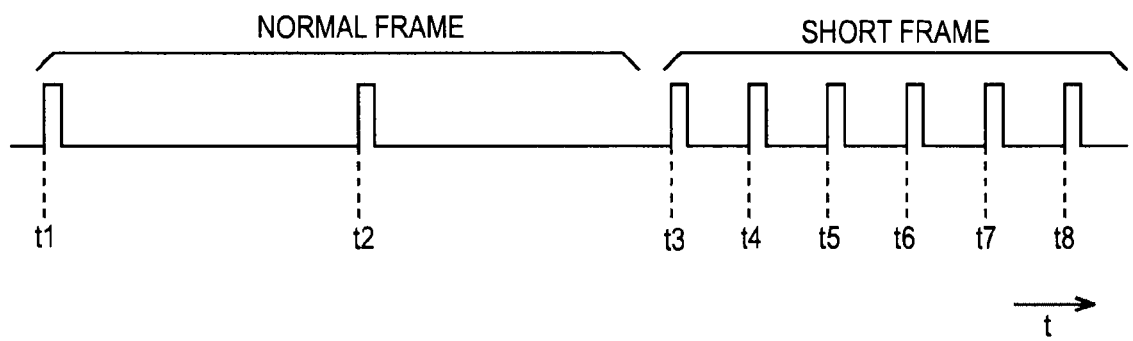
FIG. 3 is a diagram of an example of input timing of code frames.

Data of code frames having the structure shown in FIG. 1 obtained by the processing performed in the A/D conversion circuit, the demodulation circuit, and the like and a control signal as attribute information of the code frames are input to the LDPC decoding unit 11.

In the control signal, besides the LDPC code rate, the LDPC code length, and the BCH code length shown in FIGS. 2A and 2B, parameters used for processing in a circuit at a post-stage of the error correction processing unit 1 are also included. The LDPC decoding unit 11 and the BCH decoding unit 13 respectively perform processing according to the parameters included in the control signal.

The LDPC decoding unit 11 applies, every time data of one code frame (a Normal frame or a Short frame) is input, LDPC decoding processing to the input data and sequentially outputs data of a decoding result to the LDPC output buffer 12. The "data" output from the LDPC decoding unit 11 is data of a decoding result of the LDPC decoding processing. The LDPC decoding unit 11 outputs the control signal to the LDPC output buffer 12.

When the LDPC decoding unit 11 starts the LDPC decoding processing for a certain code frame, the LDPC decoding unit 11 outputs a code frame start flag $f_1$ that is a signal indicating that the LDPC decoding processing is started. While the LDPC decoding unit 11 is outputting data of the code frame to the LDPC output buffer 12, the LDPC decoding unit 11 outputs a data valid flag $f_2$ that is a signal indicating that the data is output. The code frame start flag $f_1$ and the data valid flag $f_2$ output from the LDPC decoding unit 11 are supplied to the buffer controller 14.

The LDPC output buffer 12 includes a data buffer 21 and a control signal buffer 22. The data buffer 21 stores the data supplied from the LDPC decoding unit 11. The control signal buffer 22 stores the control signal supplied from the LDPC decoding unit 11.

The buffer controller 14 controls writing (storage) of the data and the control signal in the data buffer 21 and the control signal buffer 22 or readout (output) of the data and the control signal stored in the data buffer 21 and the control signal buffer 22.

The LDPC output buffer 12 is a RAM (Random Access Memory), data writing in which and data readout from which may be unable to be simultaneously performed. The data readout is disabled when the data writing is performed. The data writing is disabled when the data readout is performed. Details of the writing of the data and the control signal in the LDPC output buffer 12 and the readout of the data and the control signal stored in the LDPC output buffer 12 are explained later.

When a code frame start flag $f_4$ is supplied from the buffer controller 14, the BCH decoding unit 13 sequentially receives data output from the data buffer 21 and stores the data in an internal buffer 31. The code frame start flag $f_4$ is a signal indicating that output of data of a certain code frame stored in the data buffer 21 is started.

The storage of the data in the internal buffer 31 is continued while a data valid flag $f_5$ is supplied from the buffer controller 14. The data valid flag $f_5$ is a signal indicating that the data of the code frame is output from the LDPC output buffer 12.

After starting the reception of the data output from the data buffer 21, the BCH decoding unit 13 starts output of an in-decoding flag $f_3$ that is a signal indicating that BCH decoding processing for the code frame is being performed. The in-decoding flag $f_3$ output from the BCH decoding unit 13 is supplied to the buffer controller 14.

When the storage of the data of the code frame (data to be subjected to the BCH decoding processing) in the internal buffer 31 is completed, the BCH decoding unit 13 applies the BCH decoding processing to the data and sequentially outputs data of a decoding result to a circuit at a post-stage. When the BCH decoding processing for the code frame ends, the BCH decoding unit 13 ends the output of the in-decoding flag $f_3$.

The BCH decoding unit 13 receives the control signal output from the control signal buffer 22 and outputs the control signal to the circuit at the post-stage at timing same as timing for outputting the data of the BCH decoding result.

As explained above, in the error correction processing unit 1, the LDPC output buffer 12 that stores an output of the LDPC decoding unit 11 is prepared and a configuration for transferring data for one code word of an LDPC code (one code frame) to the BCH decoding unit 13 after storing the data in the LDPC output buffer 12 is adopted. Consequently, the internal buffer 31 for one code word of a BCH code only has to be prepared in the BCH decoding unit 13.

Since the BCH decoding unit 13 includes only the buffer for one code word, the BCH decoding unit 13 outputs the in-decoding flag $f_3$ while the BCH decoding unit 13 is performing the BCH decoding processing. While the in-decoding flag $f_3$ is output, data of a LDPC decoding result of the next code frame of a code frame subjected to the BCH decoding is not output from the LDPC output buffer 12 to the BCH decoding unit 13.

[Timing for Writing and Readout of Data]

Timing for storage of data in the data buffer 21 and output of data stored in the data buffer 21 performed according to control by the buffer controller 14 is explained below. The control signal is explained later.

Figure 5:
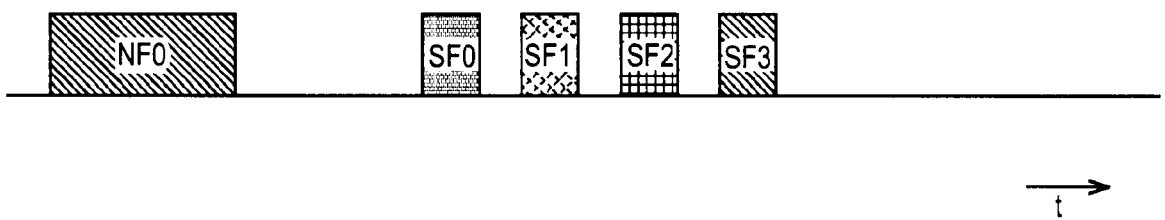
FIG. 5 is a diagram of an example of code frames input to the error correction processing unit.

FIG. 5 is a diagram of an example of code frames input to the error correction processing unit 1.

As shown in FIG. 5, following a predetermined code frame, a Normal frame NF0 and Short frames SF0 to SF3 are input to the error correction processing unit 1 in order and processing is performed.

At timing when a code frame to be input is switched from a Normal frame to a Short frame, as explained above, in some case, a loss of frames occur because, for example, data of the Short frame is output to the LDPC output buffer before processing of the Normal frame is completed.

In the error correction processing unit 1, while data of a Normal frame is output from the data buffer 21, when output of data of an LDPC decoding result of a Short frame as the next code frame of the Normal frame is started in the LDPC decoding unit 11, the output of the data of the Normal frame is suspended and the data of the Short frame is preferentially stored in the data buffer 21. When the storage of the data of the Short frame is completed, the suspended output of the data of the Normal frame is resumed.

An entire storage area of the data buffer 21 is divided into plural areas. Storage of data or output of data can be controlled for each of the areas.

Figure 6:
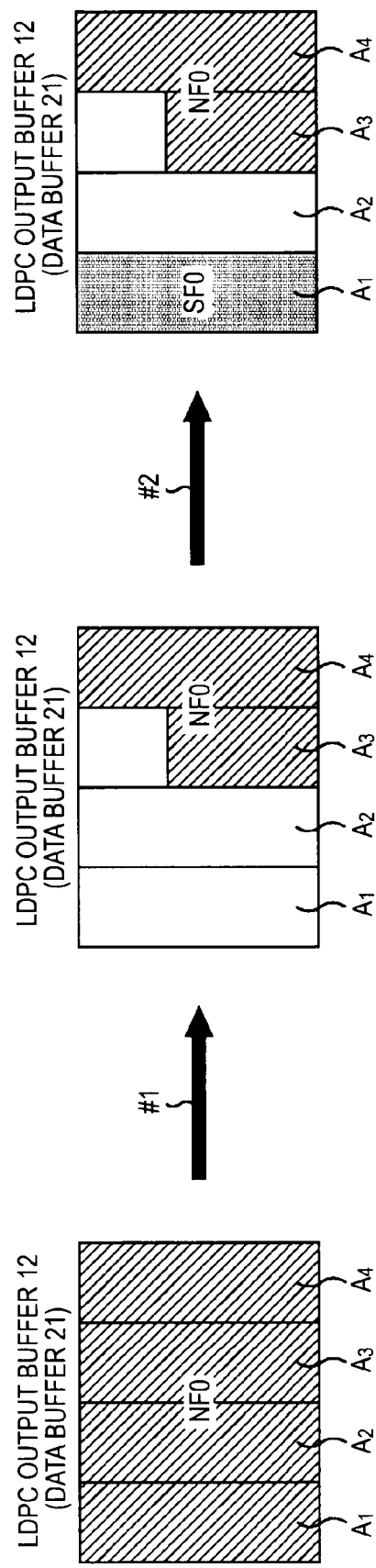
FIG. 6 is a diagram of an example of states of a data buffer.

FIG. 6 is a diagram of an example of areas formed in the data buffer 21.

When LDPC code rates are the same, a ratio of code lengths of a BCH code of a Normal frame and a BCH code of a Short frame is about 4:1 (FIGS. 2A and 2B). A capacity of the data buffer 21 is secured according to the code length of the Normal frame. Therefore, it can be said that areas for four frames are present in terms of the code length of the Short frame.

Therefore, the entire storage area of the data buffer 21 is divided into four areas $A_1$ to $A_4$. A BCH code of one Short frame can be stored in each of the areas and a BCH code of one Normal frame can be stored over the plural areas.

The data buffer 21 at the left end of FIG. 6 indicates a state in which storage of data of the Normal frame NF0 is completed. Data output from the LDPC decoding unit 11 by the LDPC decoding processing applied to the Normal frame NF0 are stored in the areas $A_1$, $A_2$, $A_3$, and $A_4$ in order. The data buffer 21 changes to a state shown at the left end of FIG. 6.

After the storage of the data of the Normal frame NF0 is completed, output of the data of the Normal frame NF0 is started. The output data of the Normal frame NF0 are sequentially received by the BCH decoding unit 13. The output of the data is performed, for example, in order of the storage of the data.

The data buffer 21 shown at the destination of an arrow #1 in FIG. 6 indicates a state in which the output of the data of the Normal frame NF0 is performed halfway. When output of the data stored in the area $A_2$ is completed following the data stored in the area $A_1$ and output of the data stored in the area $A_3$ is performed halfway, the data buffer 21 changes to the state shown at the destination of the arrow #1 in FIG. 6.

While the output of the data of the Normal frame NF0 is performed, the LDPC decoding unit 11 starts the LDPC decoding processing for the Short frame SF0 input following the Normal frame NF0. Data of a decoding result of the LDPC decoding processing for the Short frame SF0 are sequentially output from the LDPC decoding unit 11 to the data buffer 21.

For example, when the output of the data of the decoding result of the LDPC decoding processing for the Short frame SF0 is started in the state shown at the destination of the arrow #1, the output of the data of the Normal frame NF0 is suspended and storage of the data of the Short frame SF0 supplied from the LDPC decoding unit 11 is started. The data of the Short frame SF0 is written in, for example, the area $A_1$ of the areas $A_1$ and $A_2$ that are areas in which the data of the Normal frame NF0 is stored.

The data buffer 21 shown at the destination of an arrow #2 in FIG. 6 indicates a state in which the storage of the data of the Short frame SF0 is completed. When the storage of the data of the Short frame SF0 is completed, the suspended output of the data of the Normal frame NF0 is resumed. Output of the data of the Normal frame NF0 stored in the area $A_4$ is performed following the data of the Normal frame NF0 stored in the area $A_3$.

After the output of the data of the Normal frame NF0 is completed, the BCH decoding unit 13 starts the BCH decoding processing for the Normal frame NF0. While the BCH decoding processing for the Normal frame NF0 is performed, the BCH decoding unit 13 outputs the in-decoding flag $f_3$. While the in-decoding flag $f_3$ is output, output of data of the Short frame SF0 and subsequent code frames stored in the data buffer 21 is not performed.

While the in-decoding flag $f_3$ is output from the BCH decoding unit 13, the LDPC decoding unit 11 performs the LDPC decoding processing for the Short frames SF1, SF2, and SF3. Data of LDPC decoding results of the Short frames output from the LDPC decoding unit 11 are sequentially written in a free area of the data buffer 21.

Figure 7:
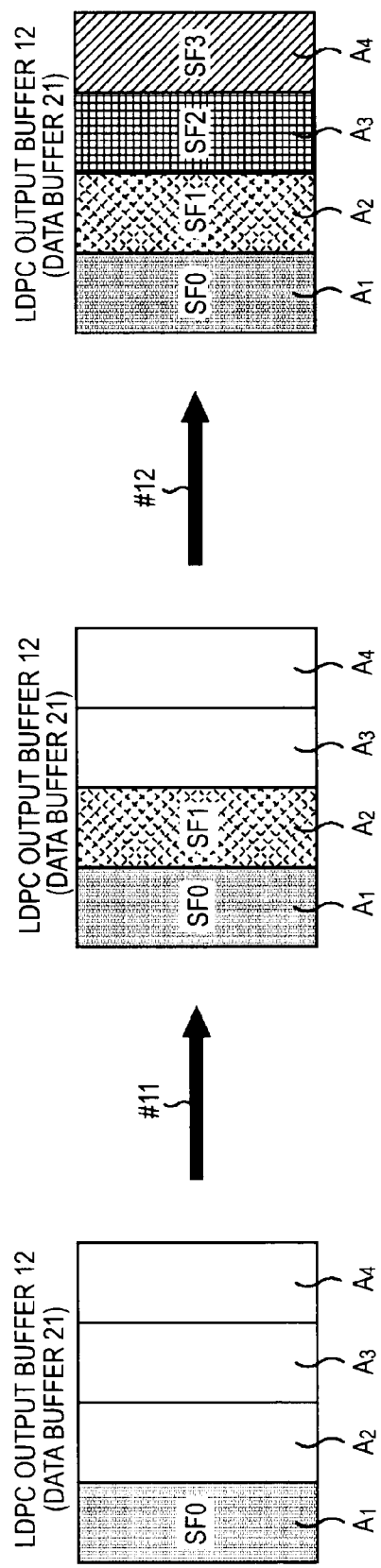
FIG. 7 is a diagram of another example of the states of the data buffer.

FIG. 7 is a diagram of states in which data of the Short frames SF1, SF2, and SF3 are stored following the Short frame SF0.

The data buffer 21 at the left end of FIG. 7 indicates a state in which in which output of the data of the Normal frame NF0 is completed. When the output of the data of the Normal frame NF0 stored in the areas $A_3$ and $A_4$ of the data buffer 21 shown at the destination of the arrow #2 in FIG. 6 is completed, only the data of the Short frame SF0 is stored in the area $A_1$.

Data of an LDPC decoding result of the Short frame SF1 output from the LDPC decoding unit 11 is stored in, for example, the area $A_2$ that is a free area of the data buffer 21.

The data buffer 21 shown at the destination of an arrow #1 in FIG. 7 indicates a state in which storage of the data of the Short frame SF1 is completed.

It is assumed that the BCH decoding processing for the Normal frame NF0 is not completed in the BCH decoding unit 13 and the output of the in-decoding flag $f_3$ is continued. Data output from the LDPC decoding unit 11 according to the LDPC decoding processing for the Short frames SF2 and SF3 are sequentially written in the free areas $A_3$ and $A_4$ of the data buffer 21.

The data buffer 21 shown at the destination of an arrow #12 in FIG. 7 indicates a state in which storage of the data of the Short frames SF2 and SF3 is completed.

When the BCH decoding processing for the Normal frame NF0 is completed in the BCH decoding unit 13 and the output of the in-decoding flag $f_3$ ends, the data of the Short frames are output from the LDPC output buffer 12 in order of the storage of the data. The BCH decoding unit 13 applies the BCH decoding processing to the data.

In this way, in the error correction processing unit 1, the storage area of the LDPC output buffer 12 is divided into four. While data of a Normal frame is output from the LDPC output buffer, when the LDPC decoding unit 11 outputs data of a Short frame, the output of the data of the Normal frame is suspended and the data of the Short frame is stored in a free area from which the output of the data of the Normal frame ends. After the data of the Short frame is stored, the output of the data of the Normal frame is resumed, whereby a loss of the code frames can be prevented.

A writing area is adaptively controlled as shown in FIG. 7, whereby data of maximum four Short frames can be stored in the data buffer 21.

Figure 8:
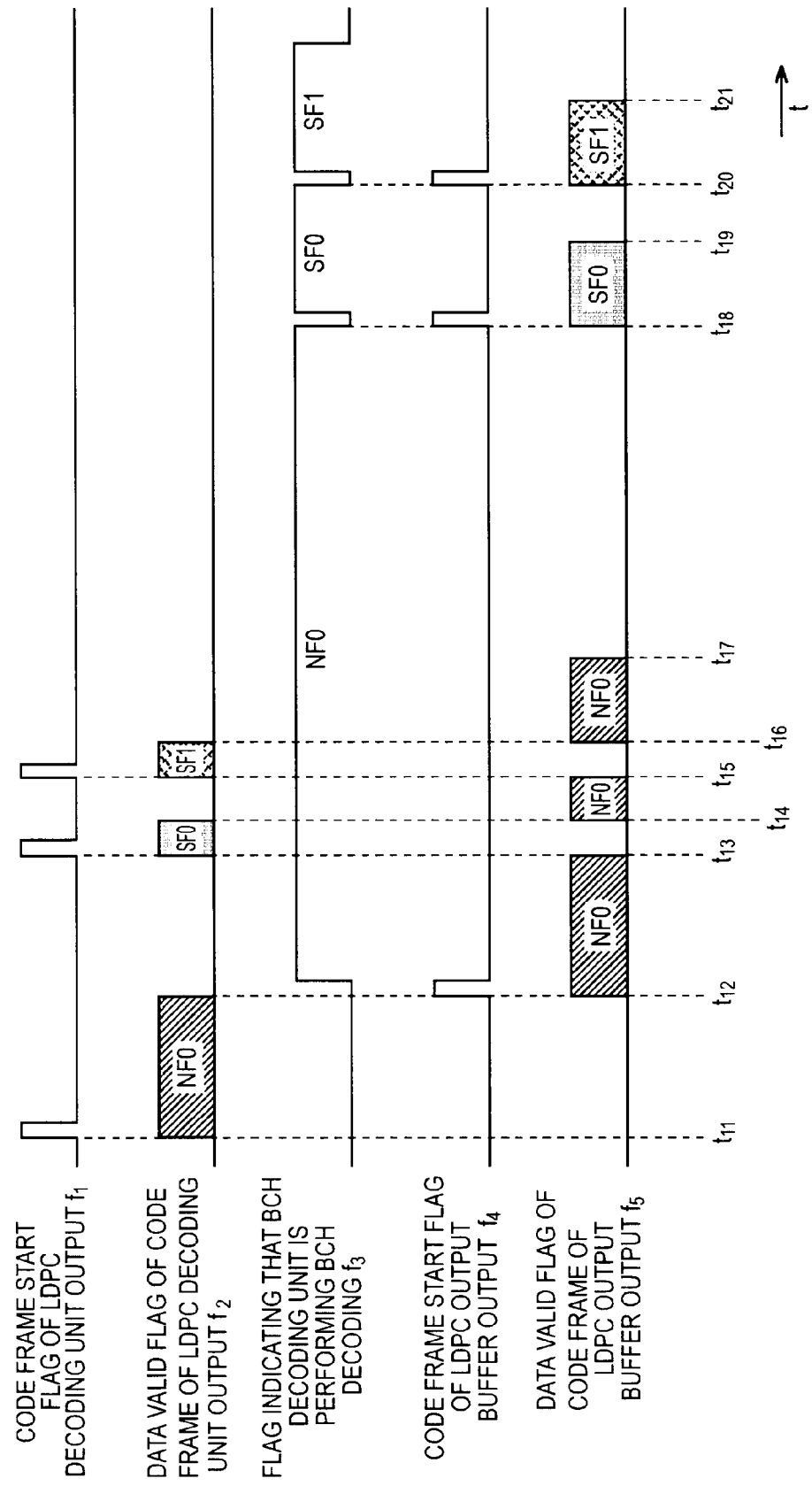
FIG. 8 is a diagram of an example of a timing chart of flags.

FIG. 8 is a diagram of a timing chart of flags output from the units when a code frame to be input is switched from a Normal frame to a Short frame.

Time $t_{11}$ is timing when output of data of an LDPC decoding result of the Normal frame NF0 is started. At time $t_{11}$, the LDPC decoding unit 11 outputs the code frame start flag $f_1$.

At time $t_{11}$, output of the data valid flag $f_2$ indicating that the output of the data of the Normal frame NF0 is performed is started. The data of the Normal frame NF0 output from the LDPC decoding unit 11 at time $t_{11}$ and subsequent times are sequentially stored in the data buffer 21.

Time $t_{12}$ is timing when the output of the data of the Normal frame NF0 from the LDPC decoding unit 11 is completed. At time $t_{12}$, the output of the data valid flag $f_2$ is ended. A state shown at the left end of FIG. 6 indicates a state of the data buffer 21 at time $t_{12}$.

At time $t_{12}$, the buffer controller 14 outputs the code frame start flag $f_4$ and output of the data valid flag $f_5$ indicating that the output of the data of the Normal frame NF0 is performed is started. Data of the Normal frame NF0 output from the data buffer 21 at time $t_{12}$ and subsequent times are sequentially stored in the internal buffer 31 of the BCH decoding unit 13.

The BCH decoding unit 13 that starts reception of the data of the Normal frame NF0 outputs the in-decoding flag $f_3$ at timing immediately after the time $t_{12}$.

Time $t_{13}$ is timing when the LDPC decoding processing is applied to the Short frame SF0 input following the Normal frame NF0 and output of data of an LDPC decoding result is started. At time $t_{13}$, the LDPC decoding unit 11 outputs the code frame start flag $f_1$.

At time $t_{13}$, output of the data valid flag $f_2$ indicating that the output of the data of the Short frame SF0 is performed is started. Data of the Short frame SF0 output from the LDPC decoding unit 11 at time $t_{13}$ and subsequent times are sequentially stored in the data buffer 21.

According to the start of the storage of the data of the Short frame SF0 at time $t_{13}$, the output of the data of the Normal frame NF0 from the data buffer 21 and the output of the data valid flag $f_5$ performed so far are ended. In other words, the output of the data of the Normal frame NF0 is suspended. The state shown at the destination of the arrow #1 in FIG. 6 indicates a state of the data buffer 21 at time $t_{13}$.

Time $t_{14}$ is timing when the output of the data of the Short frame SF0 from the LDPC decoding unit 11 is completed. At time $t_{14}$, the output of the data valid flag $f_2$ is ended. The state shown at the destination of the arrow #2 in FIG. 6 indicates a state of the data buffer 21 at time $t_{14}$.

At time $t_{14}$, output of the data valid flag $f_5$ indicating that the output of the data of the Normal frame NF0 is performed is started. In other words, the output of the data of the Normal frame NF0 is resumed. Data of the Normal frame NF0 output from the data buffer 21 at time $t_{14}$ and subsequent times are sequentially stored in the internal buffer 31 of the BCH decoding unit 13.

Time $t_{15}$ is timing when output of data of an LDPC decoding result of the Short frame SF1 input following the Short frame SF0 is started. At time $t_{15}$, the LDPC decoding unit 11 outputs the code frame start flag $f_1$.

At time $t_{15}$, output of the data valid flag $f_2$ indicating that the output of the data of the Short frame SF1 is performed is started. Data of the Short frame SF1 output from the LDPC decoding unit 11 at time $t_{15}$ and subsequent times are sequentially stored in the data buffer 21.

According to the start of the storage of the data of the Short frame SF1 at time $t_{15}$, the output of the data of the Normal frame NF0 from the data buffer 21 and the output of the data valid flag $f_5$ performed so far are ended. In other words, the output of the data of the Normal frame NF0 is suspended again.

In this example, the output of the data of the Normal frame NF0 stored in the data buffer 21 is suspended at the timing when the output of the data of the Short frame SF0 is started and the timing when the output of the data of the Short frame SF1 is started.

Time $t_{16}$ is timing when the output of the data of the Short frame SF1 from the LDPC decoding unit 11 is completed. At time $t_{16}$, the output of the data valid flag $f_2$ is ended.

At time $t_{16}$, output of the data valid flag $f_5$ indicating that the output of the data of the Normal frame NF0 is performed is started. In other words, the output of the data of the Normal frame NF0 is resumed. Data of the Normal frame NF0 output from the data buffer 21 at time $t_{16}$ and subsequent times are sequentially stored in the internal buffer 31 of the BCH decoding unit 13.

Time $t_{17}$ is timing when the output of the data of the Normal frame NF0 from the data buffer 21 is completed. At time $t_{17}$, the output of the data valid flag $f_5$ is ended. The BCH decoding processing applied to the data of the Normal frame NF0 is started at time $t_{17}$.

Time $t_{18}$ is timing when the BCH decoding processing for the Normal frame NF0 ends. At time $t_{16}$, the output of the in-decoding flag $f_3$ is ended.

At time $t_{16}$, the buffer controller 14 outputs the code frame start flag $f_4$ and output of the data valid flag $f_5$ indicating that the output of the data of the Short frame SF0 is performed is started. Data of the Short frame SF0 output from the data buffer 21 at time $t_{16}$ and subsequent times are sequentially stored in the internal buffer 31 of the BCH decoding unit 13.

The BCH decoding unit 13 that starts reception of the data of the Short frame SF0 outputs the in-decoding flag $f_3$ at timing immediately after time $t_{18}$.

Time $t_{19}$ is timing when the output of the data of the Short frame SF0 from the data buffer 21 is completed. At time $t_{19}$, the output of the data valid flag $f_5$ is ended. The BCH decoding processing applied to the data of the Short frame SF0 is started at time $t_{19}$.

Time $t_{20}$ is timing when the BCH decoding processing for the Short frame SF0 ends. At time $t_{20}$, the output of the in-decoding flag $f_3$ is ended.

At time $t_{20}$, the buffer controller 14 outputs the code frame start flag $f_4$ and output of the data valid flag $f_5$ indicating that the output of the data of the Short frame SF1 is performed is started. Data of the Short frame SF1 output from the data buffer 21 at time $t_{20}$ and subsequent times are sequentially stored in the internal buffer 31 of the BCH decoding unit 13.

The BCH decoding unit 13 that starts reception of the data of the Short frame SF1 outputs the in-decoding flag $f_3$ at timing immediately after time $t_{20}$.

Time $t_{21}$ is timing when the output of the data of the Short frame SF1 from the data buffer 21 is completed. At time $t_{21}$, the output of the data valid flag $f_5$ is ended. The BCH decoding processing applied to the data of the Short frame SF1 is started at time $t_{21}$.

Figure 9:
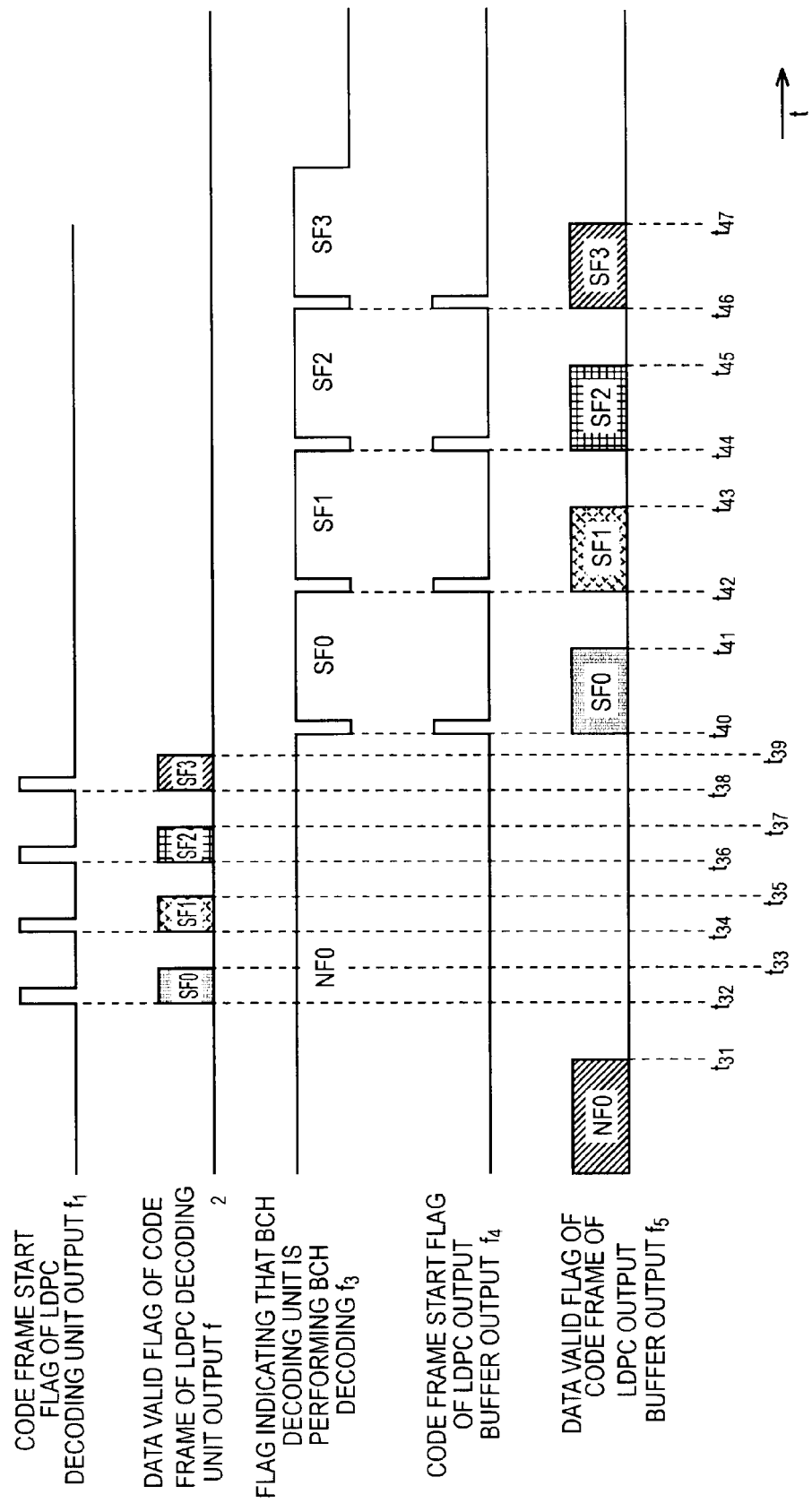
FIG. 9 is a diagram of another example of the timing chart of the flags.

FIG. 9 is a diagram of a timing chart of flags output from the units when the Short frames SF0 to SF3 are input following the Normal frame NF0.

Time $t_{31}$ is timing when the output of the data of the Normal frame NF0 from the data buffer 21 is completed. At time $t_{31}$, the output of the data valid flag $f_5$ is ended. The BCH decoding processing applied to the data of the Normal frame NF0 is started at time $t_{31}$.

In FIG. 9, timing for output of the data of the Normal frame NF0 from the LDPC decoding unit 11, timing for output from the data buffer 21, and the like are not shown. The in-decoding flag $f_3$ indicating that the BCH decoding processing for the Normal frame NF0 is being performed is output before time $t_{31}$.

Time $t_{32}$ is timing when output of data of an LDPC decoding result of the Short frame SF0 is started. At time $t_{32}$, the code frame start flag $f_1$ is output from the LDPC decoding unit 11.

At time $t_{32}$, output of the data valid flag $f_2$ indicating that the output of the data of the Short frame SF0 is performed is started. Data of the Short frame SF0 output from the LDPC decoding unit 11 at time $t_{32}$ and subsequent times are sequentially stored in the data buffer 21.

Time $t_{33}$ is timing when the output of the data of the Short frame SF0 from the LDPC decoding unit 11 is completed. At time $t_{33}$, the output of the data valid flag $f_2$ is ended. The state shown at the left end of FIG. 7 indicates a state of the data buffer 21 at time $t_{33}$.

Time $t_{34}$ is timing when output of data of an LDPC decoding result of the Short frame SF1 is started. At time $t_{34}$, the LDPC decoding unit 11 outputs the code frame start flag $f_1$.

At time $t_{34}$, output of the data valid flag $f_2$ indicating that the output of the data of the Short flag SF1 is performed is started. Data of the Short frame SF1 output from the LDPC decoding unit 11 at time $t_{34}$ and subsequent times are sequentially stored in the data buffer 21.

Time $t_{35}$ is timing when the output of the data of the Short frame SF1 from the LDPC decoding unit 11 is completed. At time $t_{35}$, the output of the data valid flag $f_2$ is ended. The state shown at the destination of the arrow #11 in FIG. 7 indicates a state of the data buffer 21 at time $t_{35}$.

Time $t_{36}$ is timing when output of data of an LDPC result of the Short frame SF2 is started. At time $t_{36}$, the LDPC decoding unit 11 outputs the code frame start flag $f_1$.

At time $t_{36}$, output of the data valid flag $f_2$ indicating that the output of the data of the Short frame SF2 is performed is started. Data of the Short frame SF2 output from the LDPC decoding unit 11 at time $t_{36}$ and subsequent times are sequentially stored in the data buffer 21.

Time $t_{37}$ is timing when the output of the data of the Short frame SF2 from the LDPC decoding unit 11 is completed. At time $t_{37}$, the output of the data valid flag $f_2$ is ended.

Time $t_{38}$ is timing when output of data of an LDPC decoding result of the Short frame SF3 is started. At time $t_{38}$, the LDPC decoding unit 11 outputs the code frame start flag $f_1$.

At time $t_{38}$, output of the data valid flag $f_2$ indicating that the output of the data of the Short frame SF3 is performed is started. Data of the Short frame SF3 output from the LDPC decoding unit 11 at time $t_{38}$ and subsequent times are sequentially stored in the data buffer 21.

Time $t_{39}$ is timing when the output of the data of the Short frame SF3 from the LDPC decoding unit 11 is completed. At time $t_{39}$, the output of the data valid flag $f_2$ is ended.

The data of the Short frames output from the LDPC decoding unit 11 at the timings explained above during the BCH decoding processing of the Normal frame NF0 are stored in the areas of the data buffer 21 as shown at the destination of the arrow #12 in FIG. 7.

Time $t_{40}$ is timing when the BCH decoding processing for the Normal frame NF0 ends. At time $t_{40}$, the output of the in-decoding flag $f_3$ is ended.

At time $t_{40}$, the buffer controller 14 outputs the code frame start flag $f_4$ and output of the data valid flag $f_5$ indicating that the output of the data of the Short frame SF0 is performed is started. Data of the Short frame SF0 output from the data buffer 21 at time $t_{40}$ and subsequent times are sequentially stored in the internal buffer 31 of the BCH decoding unit 13.

The BCH decoding unit 13 that starts reception of the data of the Short frame SF0 outputs the in-decoding flag $f_3$ at timing immediately after time $t_{40}$.

Time $t_{41}$ is timing when the output of the data of the Short frame SF0 from the data buffer 21 is completed. At time $t_{41}$, the output of the data valid flag $f_5$ is ended. The BCH decoding processing applied to the data of the Short frame SF0 is started at time $t_{41}$.

Time $t_{42}$ is timing when the BCH decoding processing for the Short frame SF0 ends. At time $t_{42}$, the output of the in-decoding flag $f_3$ is ended.

At time $t_{42}$, the buffer controller 14 outputs the code frame start flag $f_4$ and output of the data valid flag $f_5$ indicating that the output of the data of the Short frame SF1 is performed is started. Data of the Short frame SF1 output from the data buffer 21 at time $t_{42}$ and subsequent times are sequentially stored in the internal buffer 31 of the BCH decoding unit 13.

The BCH decoding unit 13 that starts reception of the data of the Short frame SF1 outputs the in-decoding flag $f_3$ at timing immediately after time $t_{42}$.

Time $t_{43}$ is timing when the output of the data of the Short frame SF1 from the data buffer 21 is completed. At time $t_{43}$, the output of the data valid flag $f_5$ is ended. The BCH decoding processing applied to the data of the Short frame SF1 is started at time $t_{43}$.

Time $t_{44}$ is timing when the BCH decoding processing for the Short frame SF1 ends. At time $t_{44}$, the output of the in-decoding flag $f_3$ is ended.

At time $t_{44}$, the buffer controller 14 outputs the code frame start flag $f_4$ and output of the data valid flag $f_5$ indicating that the output of the data of the Short frame SF2 is performed is started. Data of the Short frame SF2 read out from the data buffer 21 at time $t_{44}$ and subsequent times are sequentially stored in the internal buffer 31 of the BCH decoding unit 13.

The BCH decoding unit 13 that starts the reception of the data of the Short frame SF2 outputs the in-decoding flag $f_3$ at timing immediately after time $t_{44}$.

Time $t_{45}$ is timing when the output of the data of the Short frame SF2 from the data buffer 21 is completed. At time $t_{45}$, the output of the data valid flag $f_5$ is ended. The BCH decoding processing applied to the data of the Short frame SF2 is started at time $t_{45}$.

Time $t_{46}$ is timing when the BCH decoding processing for the Short frame SF2 ends. At time $t_{46}$, the output of the in-decoding flag $f_3$ is ended.

At time $t_{46}$, the buffer controller 14 outputs the code frame start flag $f_4$ and output of the data valid flag $f_5$ indicating that the output of the data of the Short frame SF3 is performed is started. Data of the Short frame SF3 read out from the data buffer 21 at time $t_{46}$ and subsequent times are sequentially stored in the internal buffer 31 of the BCH decoding unit 13.

The BCH decoding unit 13 that starts reception of the data of the Short frame SF3 outputs the in-decoding flag $f_3$ at timing immediately after time $t_{46}$.

Time $t_{47}$ is timing when the output of the data of the Short frame SF3 from the data buffer 21 is completed. At time $t_{47}$, the output of the data valid flag $f_5$ is ended. The BCH decoding processing applied to the data of the Short SF3 is started at time $t_{47}$.

[Timing for Writing and Readout of a Control Signal]

Figure 10:
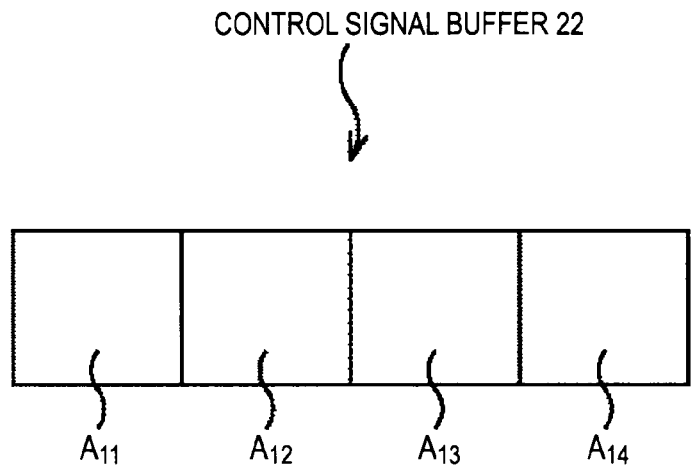
FIG. 10 is a diagram of a configuration example of a control signal buffer.

FIG. 10 is a diagram of an example of areas formed in the control signal buffer 22.

Like the data buffer 21, an entire storage area of the control signal buffer 22 is divided into four areas $A_{11}$ to $A_{14}$. A control signal for one code frame can be stored in each of the areas. When the Short frames SF0 to SF3 are stored in the areas $A_1$ to $A_4$ of the data buffer 21 as shown in FIG. 7, control signals for the Short frames SF0 to SF3 are respectively stored in the areas $A_{11}$ to $A_{14}$ of the control signal buffer 22.

At timing same as the timing for outputting the code frame start flag $f_1$, i.e., timing for starting output of data of an LDPC decoding result of a certain code frame, the LDPC decoding unit 11 outputs a control signal for the code frame. Control signals output from the LDPC decoding unit 11 are sequentially stored in a free area of the control signal buffer 22.

The control signals stored in the control signal buffer 22 are output, in order of the storage, timing when the code frame start flag $f_4$ is output, i.e., output of data of a certain code frame from the data buffer 21 is started. The control signal buffer 22 is a memory of a FIFO (First In First Out) format. The control signals output from the control signal buffer 22 are received by the BCH decoding unit 13 and output to a circuit at a post-stage at timing same as timing for outputting data of a BCH decoding result.

For example, output of data of the code frames and storage of the data are performed at the timings explained with reference to FIG. 8. In this case, a control signal for the Normal frame NF0 is output from the LDPC decoding unit 11 at time $t_{11}$ and stored in, for example, the area $A_{11}$ that is a free area of the control signal buffer 22. The control signal for the Normal frame NF0 stored in the area $A_{11}$ is output to the BCH decoding unit 13 at time $t_{12}$.

The control signal for the Short frame SF0 is output from the LDPC decoding unit 11 at time $t_{13}$ and stored in, for example, the area $A_{11}$ that is a free area of the control signal buffer 22.

A control signal for the Short frame SF1 is output from the LDPC decoding unit 11 at time $t_{15}$ and stored in, for example, the area $A_{12}$ that is a free area of the control signal buffer 22. At time $t_{15}$, the control signal for the Short frame SF0 is already stored in the area $A_{11}$.

The control signal for the Short frame SF0 stored in the area $A_{11}$ is output to the BCH decoding unit 13 at time $t_{18}$. The control signal of the Short frame SF1 stored in the area $A_{12}$ is output to the BCH decoding unit 13 at time $t_{20}$.

In this way, the control signals are output from the LDPC decoding unit 11 in synchronization with the data of the code frames and stored in the control signal buffer 22. After being temporarily stored in the control signal buffer 22, the control signals are supplied to the BCH decoding unit 13 in synchronization with the data of the code frames.

[Operations of the Units]

The operations of the LDPC decoding unit 11, the BCH decoding unit 13, and the buffer controller 14 that process data of code frames are explained below. Kinds of processing explained below are repeatedly performed in parallel in the units.

Figure 11:
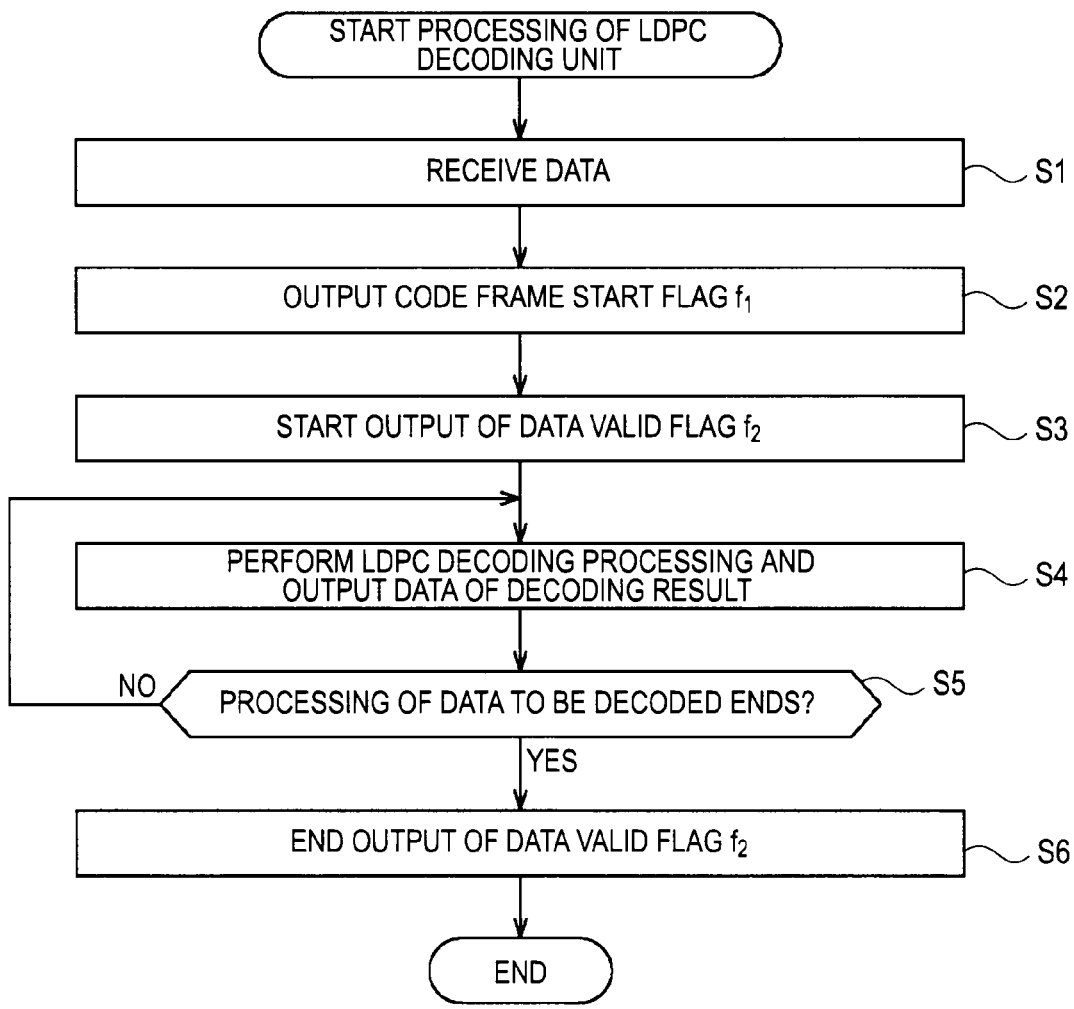
FIG. 11 is a flowchart for explaining processing by an LDPC decoding unit.

First, processing by the LDPC decoding unit 11 is explained with reference to a flowchart shown in FIG. 11. This processing is performed every time data of each of the code frames is input.

In step S1, the LDPC decoding unit 11 receives data of an input code frame.

In step S2, the LDPC decoding unit 11 outputs the code frame start flag $f_1$ (outputs a value 1).

In step S3, the LDPC decoding unit 11 starts output of the data valid flag $f_2$.

In step S4, the LDPC decoding unit 11 applies the LDPC decoding processing to the input code frame and outputs data of a decoding result.

In step S5, the LDPC decoding unit 11 determines whether the LDPC decoding processing for the code frame to be subjected to the LDPC decoding processing ends. When the LDPC decoding unit 11 determines that the LDPC decoding processing does not end, the LDPC decoding unit 11 returns to step S4 and repeats the LDPC decoding processing.

On the other hand, when the LDPC decoding unit 11 determines in step S5 that the LDPC decoding processing for the code frame to be subjected to the LDPC decoding processing ends, in step S6, the LDPC decoding unit 11 ends the output of the data valid flag $f_2$ (starts output of a value 0) and ends the processing.

Figure 12:
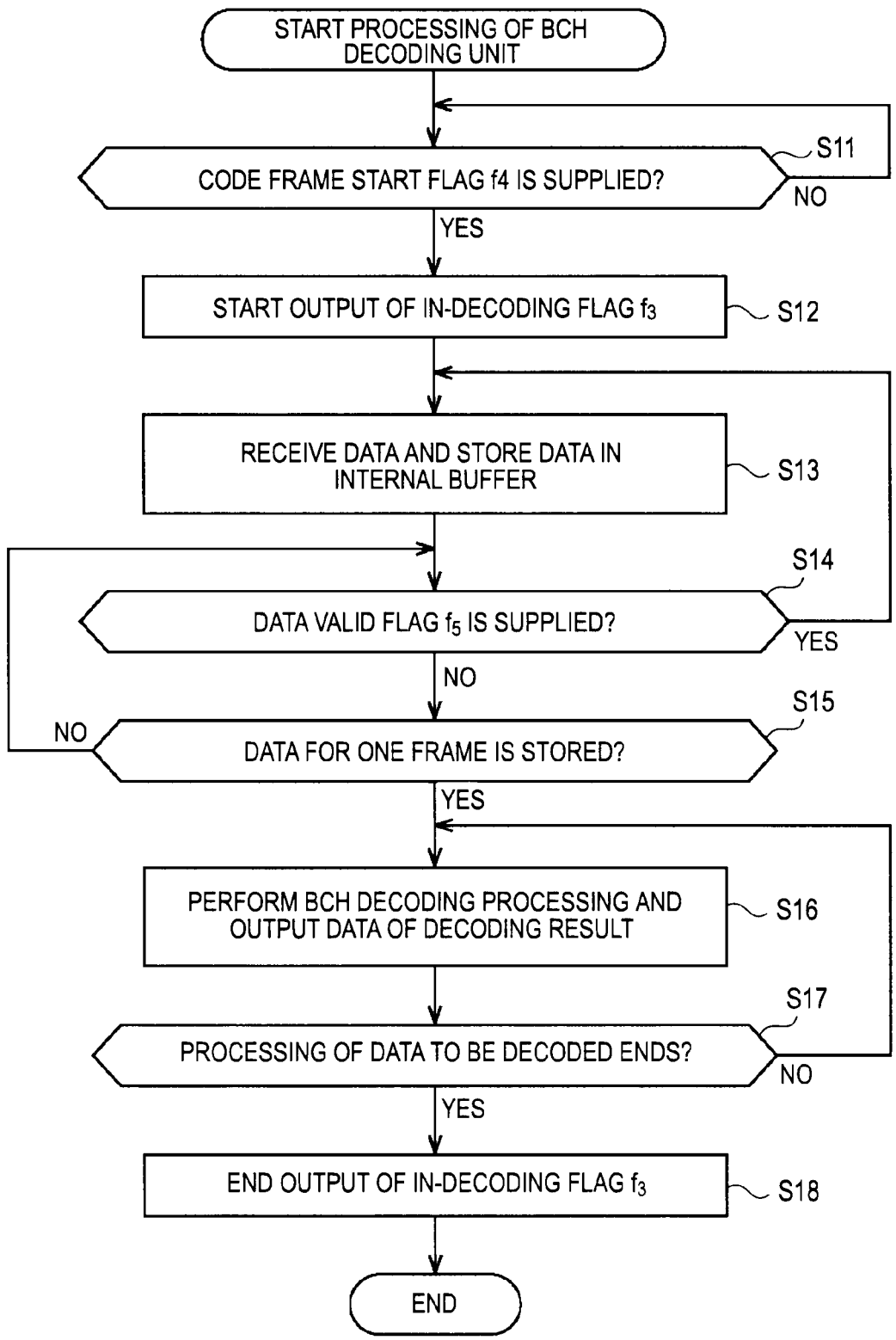
FIG. 12 is a flowchart for explaining processing by a BCH decoding unit.

Processing by the BCH decoding unit 13 is explained below with reference to a flowchart shown in FIG. 12.

In step S11, the BCH decoding unit 13 determines whether the code frame start flag $f_4$ is supplied (whether a value of the code frame start flag $f_4$ is 1). The BCH decoding unit 13 stays on standby until the BCH decoding unit 13 determines that the code frame start flag $f_4$ is supplied.

When the BCH decoding unit 13 determines in step S11 that the code frame start flag $f_4$ is supplied, in step S12, the BCH decoding unit 13 starts output of the in-decoding flag $f_3$.

In step S13, the BCH decoding unit 13 receives data supplied from the data buffer 21 and causes the internal buffer 31 to store the data.

In step S14, the BCH decoding unit 13 determines whether the data valid flag $f_5$ is supplied. When the BCH decoding unit 13 determines that the data valid flag $f_5$ is supplied, the BCH decoding unit 13 returns to step S13 and continues storage of data supplied from the data buffer 21.

On the other hand, when the BCH decoding unit 13 determines in step S14 that the data valid flag $f_5$ is not supplied (a value of the data valid flag $f_5$ is 0), in step S15, the BCH decoding unit 13 determines whether data for one frame is stored in the internal buffer 31.

When the BCH decoding unit 13 determines in step S15 that the data for one frame is not stored in the internal buffer 31, the BCH decoding unit 13 returns to step S14 and repeats the same processing. When the output of data from the data buffer 21 to the BCH decoding unit 13 is suspended because output of data of an LDPC decoding result of the next code frame is started, even if a value of the data valid flag $f_5$ is 0, the BCH decoding unit 13 determines that the data for one frame is not stored in the internal buffer 31.

On the other hand, when the BCH decoding unit 13 determines in step S15 that the data for one frame is stored in the internal buffer 31, in step S16, the BCH decoding unit 13 applies the BCH decoding processing to the data stored in the internal buffer 31 and outputs data of a decoding result.

In step S17, the BCH decoding unit 13 determines whether the BCH decoding processing for the code frame to be subjected to the BCH decoding processing ends. When the BCH decoding unit 13 determines that the BCH decoding processing does not end, the BCH decoding unit 13 returns to step S16 and repeats the BCH decoding processing.

When the BCH decoding unit 13 determines in step S17 that the BCH decoding processing for the code frame to be subjected to the BCH decoding processing ends, in step S18, the BCH decoding unit 13 ends the output of the in-decoding flag $f_3$ and ends the processing.

Processing by the buffer controller 14 for controlling storage of data in the data buffer 21 is explained below with reference to a flowchart shown in FIG. 13.

Figure 13:
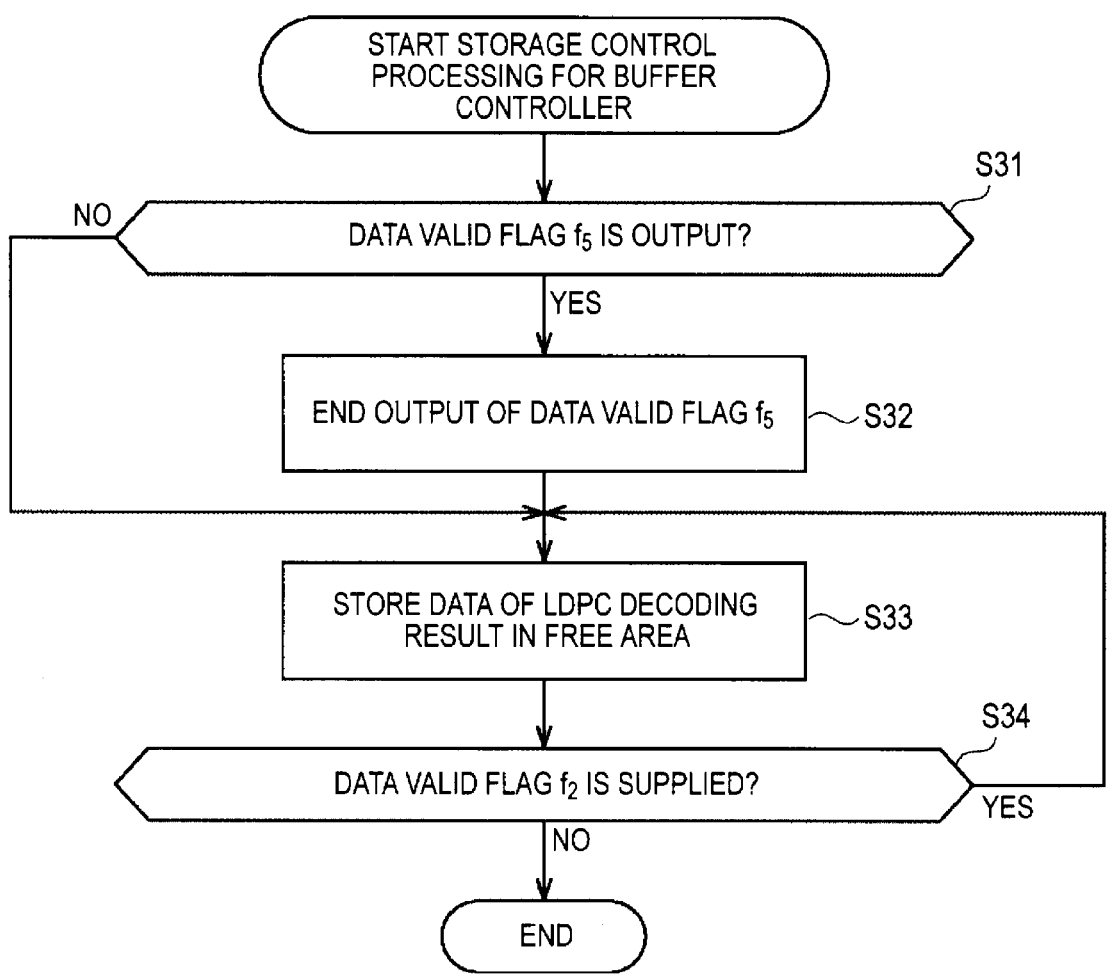
FIG. 13 is a flowchart for explaining storage control processing by a buffer controller.

The processing shown in FIG. 13 is started when the code frame start flag $f_1$ is supplied. When the code frame start flag $f_1$ is supplied while processing shown in FIG. 14 explained later is performed, the processing shown in FIG. 13 is performed in an interruptive manner.

In step S31, the buffer controller 14 determines whether the data valid flag $f_5$ is output.

When the buffer controller 14 determines in step S31 that the data valid flag $f_5$ is output, in step S32, the buffer controller 14 ends the output of the data valid flag $f_5$. For example, when the processing shown in FIG. 13 is started in an interruptive manner while data is output from the data buffer 21 to the BCH decoding unit 13, the buffer controller 14 determines that the data valid flag $f_5$ is output. When the buffer controller 14 determines in step S31 that the data valid flag $f_5$ is not output, step S32 is skipped.

In step S33, the buffer controller 14 causes the data buffer 21 to store data of an LDPC decoding result output from the LDPC decoding unit 11 in a free area of the data buffer 21.

In step S34, the buffer controller 14 determines whether the data valid flag $f_2$ is supplied from the LDPC decoding unit 11.

When the buffer controller 14 determines in step S34 that the data valid flag $f_2$ is supplied, the buffer controller 14 returns to step S33 and repeatedly causes the data buffer 21 to store data of an LDPC decoding result. When the buffer controller 14 determines in step S34 that the data valid flag $f_2$ is not supplied, the buffer controller 14 ends the processing.

Processing by the buffer controller 14 for controlling output of data stored in the data buffer 21 to the BCH decoding unit 13 is explained below with reference to a flowchart shown in FIG. 14.

Figure 14:
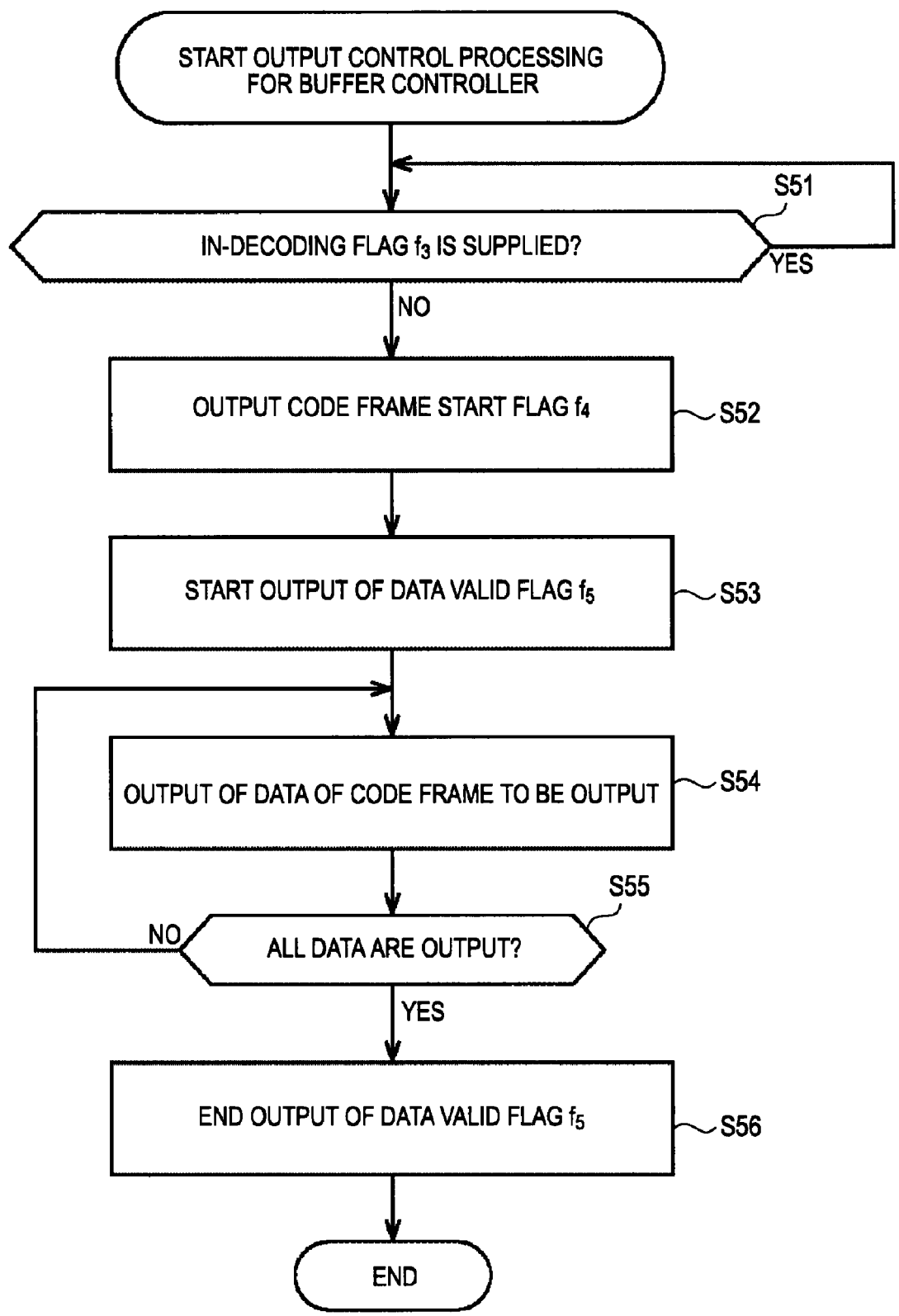
FIG. 14 is a flowchart for explaining output control processing by the buffer controller.

The processing shown in FIG. 14 is started when data for one frame is stored in the data buffer 21.

In step S51, the buffer controller 14 determines whether the in-decoding flag $f_3$ is supplied from the BCH decoding unit 13. The buffer controller 14 stays on standby until the buffer controller 14 determines that the in-decoding flag $f_3$ is not supplied.

When the buffer controller 14 determines in step S51 that the in-decoding flag $f_3$ is not supplied, in step S52, the buffer controller 14 outputs the code frame start flag $f_4$.

In step S53, the buffer controller 14 starts output of the data valid flag $f_5$.

In step S54, the buffer controller 14 outputs the data of the code frame to be output stored in the data buffer 21.

In step S55, the buffer controller 14 determines whether all the data of the code frame to be output are output. When the buffer controller 14 determines that not all of the data are output, the buffer controller 14 returns to step S54 and repeats the output of data.

On the other hand, when the buffer controller 14 determines in step S55 that all the data of the code frame to be output are output, in step S56, the buffer controller 14 ends the output of the data valid flag $f_5$ and ends the processing.

Since the processing explained above is performed in the units, it is possible to prevent a loss of code frames.

In the case mainly explained above, a code frame to be input is switched from a Normal frame to a Short frame. However, when the code frame to be input is switched from the Short frame to the Normal frame, since a frame interval of the Normal frame is long compared with a frame interval of the Short frame, it is not particularly necessary to perform processing for, for example, suspending the output of data from the data buffer 21.

The processing for code frames of the DVB-T2 standard is explained above. However, the present invention is also applicable when data of other code frames in which a concatenated code of an inner code and an outer code is used as an error correction code and plural code frame lengths are specified is processed.

[Modifications]

FIG. 15 is a block diagram of a configuration example of a first embodiment of a receiving system to which the error correction processing unit 1 is applied.

The receiving system shown in FIG. 15 includes an acquiring unit 101, a transmission channel decoding processing unit 102, and an information source decoding processing unit 103.

The acquiring unit 101 acquires a signal via a not-shown transmission channel such as a terrestrial digital broadcast, a satellite digital broadcast, a CATV network, the Internet, or other networks and supplies the signal to the transmission channel decoding processing unit 102.

The transmission channel decoding processing unit 102 applies transmission channel decoding processing including error correction to the signal acquired by the acquiring unit 101 via the transmission channel and supplies a signal obtained as a result of the transmission channel decoding processing to the information source decoding processing unit 103. The error correction processing unit 1 shown in FIG. 4 is included in the transmission channel decoding processing unit 102.

The information source decoding processing unit 103 applies, to the signal subjected to the transmission channel decoding processing, information source decoding processing including processing for expanding compressed information to original information and acquiring transmission target data.

In some case, compression encoding for compressing information is applied to the signal acquired by the acquiring unit 101 via the transmission channel in order to reduce data amounts of an image, sound, and the like. In that case, the information source decoding processing unit 103 applies, to the signal subjected to the transmission channel decoding processing, the information source decoding processing such as the processing for expanding compressed information to original information.

When the compression encoding is not applied to the signal acquired by the acquiring unit 101 via the transmission channel, the information source decoding processing unit 103 does not perform the processing for expanding compressed information to original information. As the expansion processing, for example, there is MPEG decoding. In some case, the information source decoding processing includes descrambling or the like besides the expansion processing.

The receiving system shown in FIG. 15 can be applied to, for example, a television tuner that receives a digital television broadcast. Each of the acquiring unit 101, the transmission channel decoding processing unit 102, and the information source decoding processing unit 103 can be configured as one independent apparatus (hardware (an IC (Integrated Circuit), etc.)) or a software module).

A set of the acquiring unit 101, the transmission channel decoding processing unit 102, and the information source decoding processing unit 103 can be configured as one independent apparatus. A set of the acquiring unit 101 and the transmission channel decoding processing unit 102 can be configured as one independent apparatus. A set of the transmission channel decoding processing unit 102 and the information source decoding processing unit 103 can also be configured as one independent apparatus.

FIG. 16 is a block diagram of a configuration example of a second embodiment of the receiving system to which the error correction processing unit 1 is applied.

Among components shown in FIG. 16, components corresponding to the components shown in FIG. 15 are denoted by the same reference numerals and explanation of the components is omitted as appropriate.

The configuration of the receiving system shown in FIG. 16 is the same as the configuration shown in FIG. 15 in that receiving system includes the acquiring unit 101, the transmission channel decoding processing unit 102, and the information source decoding processing unit 103. The configuration of the receiving system is different from the configuration shown in FIG. 15 in that an output unit 111 is provided anew.

The output unit 111 is, for example, a display device that displays an image or a speaker that outputs sound. The output unit 111 outputs an image, sound, or the like output from the information source decoding processing unit 103 as a signal. In other words, the output unit 111 displays an image or outputs sound.

The receiving system shown in FIG. 16 can be applied to, for example, a television that receives a television broadcast provided as a digital broadcast or a radio receiver that receives a radio broadcast.

When the compression encoding is not applied to a signal acquired by the acquiring unit 101, a signal output by the transmission channel decoding processing unit 102 is directly supplied to the output unit 111.

FIG. 17 is a block diagram of a configuration example of a third embodiment of the receiving system to which the error correction processing unit 1 is applied.

Among components shown in FIG. 17, components corresponding to the components shown in FIG. 15 are denoted by the same reference numerals and explanation of the components is omitted.

The configuration of the receiving system shown in FIG. 17 is the same as the configuration shown in FIG. 15 in that the receiving system includes the acquiring unit 101 and the transmission channel decoding processing unit 102. The configuration of the receiving system is different from the configuration shown in FIG. 15 in that a recording unit 121 is provided anew.

The recording unit 121 records a signal (e.g., a TS packet of TS of MPEG) output by the transmission channel decoding processing unit 102 in a recording (storage) medium such as an optical disk, a hard disk (a magnetic disk), or a flash memory (causes the recording medium to store the signal).

The receiving system shown in FIG. 17 can be applied to a recorder apparatus or the like that records a television broadcast.

It is also possible that the information source decoding processing unit 103 is provided and the recording unit 121 records a signal subjected to the information source decoding processing by the information source decoding processing unit 103, i.e., an image or sound obtained by decoding.

The series of processing explained above can be executed by hardware or can be executed by software. When the series of processing is executed by the software, a computer program forming the software is installed in a computer incorporated in a dedicated hardware, a general-purpose personal computer, or the like from a program recording medium.

FIG. 18 is a block diagram of a configuration example of hardware of a computer that executes the series of processing according to a computer program.

A CPU (Central Processing Unit) 151, a ROM (Read Only Memory) 152, and a RAM (Random Access Memory) 153 are connected to one another by a bus 154.

An input and output interface 155 is further connected to the bus 154. An input unit 156 including a keyboard or a mouse and an output unit 157 including a display or a speaker are connected to the input and output interface 155. A storing unit 158 including a hard disk or a nonvolatile memory, a communication unit 159 including a network interface, and a drive 160 that drives a removable medium 161 are connected to the input and output interface 155.

In the computer configured as explained above, the CPU 151 loads, for example, a computer program stored in the storing unit 158 to the RAM 153 via the input and output interface 155 and the bus 154 and executes the computer program, whereby the series of processing is performed.

The computer program executed by the CPU 151 is provided while being recorded in, for example, the removable medium 161 or via a wired or wireless transmission medium such as a local area network, the Internet, or a digital broadcast and installed in the storing unit 158.

The computer program executed by the computer may be a computer program in which the processing is performed in time series according to the order explained in this specification or may be a computer program in which the processing is performed in parallel or at necessary timing such as timing when the computer program is invoked.

Embodiments of the present invention are not limited to the embodiments explained above. Various modifications of the embodiments are possible without departing from the spirit of the present invention.

The present application contains subject matter related to that disclosed in Japanese Priority Patent Application JP 2009-247757 filed in the Japan Patent Office on Oct. 28, 2009, the entire contents of which is hereby incorporated by reference.

What is claimed is:

1. A receiving apparatus comprising:
   a first decoding means for performing, every time frame data in which an inner code and an outer code are used as error correction codes is transmitted thereto, decoding processing employing the inner code and outputting decoded data;
   a storing means for storing the decoded data;
   a second decoding means for applying decoding processing employing the outer code to the decoded data output from the storing means; and
   a control means for controlling storage of the decoded data in the storing means, for controlling output of the decoded data from the storing means, and for suspending, while the control means causes the storing means to output first decoded data as the decoded data of a decoding result of first frame data to the second decoding means and when the first decoding means starts output of second decoded data as the decoded data of a decoding result of second frame data transmitted following the first frame data, the output of the first decoded data to the second decoding means and cause the storing means to store the second decoded data and, when the storage of the second decoded data ends, for instructing the storing means to resume the output of the first decoded data to the second decoding means.

2. The receiving apparatus according to claim 1, wherein the frame data is data of a Normal frame or data of a Short frame specified in DVB-T2.

3. The receiving apparatus according to claim 2, wherein the storing means has four storage areas in which the decoded data of a decoding result of data of a singularity of the Normal frame can be stored over the plural areas or the decoded data of a decoding result of data of a singularity of the Short frame can be stored in each of the areas can be provided in the storing means.

4. The receiving apparatus according to claim 3, wherein
   the first frame data is the data of the Normal frame,
   the second frame data is the data of the Short frame, and
   the control means causes, while the control means causes the storing means to output the first decoded data to the second decoding means, when the first decoding means starts the output of the second decoded data, a singularity of the storage area, in which the first decoded data finished to be output is stored, to store the second decoded data.

5. A receiving method for a receiving apparatus, the method comprising:
   performing, by a first decoding means every time frame data in which an inner code and an outer code are used as error correction codes is transmitted thereto, decoding processing employing the inner code and outputting decoded data;
   storing, by a storing means, the decoded data;
   applying, by a second decoding means, decoding processing employing the outer code to the decoded data output from the storing means;
   controlling storage of the decoded data in the storing means, output of the decoded data from the storing means a suspension of, while causing the storing means to output first decoded data as the decoded data of a decoding result of first frame data to the second decoding means and when the first decoding means starts output of second decoded data as the decoded data of a decoding result of second frame data transmitted following the first frame data, the output of the first decoded data to the second decoding means and cause the storing means to store the second decoded data and, when the storage of the second decoded data ends; and
instructing the storing means to resume the output of the first decoded data to the second decoding means.

6. A non-transitory computer readable storage medium which when executed by a processor in a receiving apparatus causes the processor to execute a method comprising:
performing, by a first decoding means every time frame data in which an inner code and an outer code are used as error correction codes is transmitted thereto, decoding processing employing the inner code and outputting decoded data;
storing, by a storing means, the decoded data;
applying, by a second decoding means, decoding processing employing the outer code to the decoded data output from the storing means;
controlling storage of the decoded data in the storing means, output of the decoded data from the storing means a suspension of, while causing the storing means to output first decoded data as the decoded data of a decoding result of first frame data to the second decoding means and when the first decoding means starts output of second decoded data as the decoded data of a decoding result of second frame data transmitted following the first frame data, the output of the first decoded data to the second decoding means and cause the storing means to store the second decoded data and, when the storage of the second decoded data ends; and,
instructing the storing means to resume the output of the first decoded data to the second decoding means.

7. A receiving system comprising:
an acquiring means for acquiring a signal transmitted via a transmission channel; and
a transmission channel decoding processing means for applying processing including error correction processing to the signal acquired by the acquiring means, wherein
the transmission channel decoding processing means includes
a first decoding means for performing, every time frame data in which an inner code and an outer code are used as error correction codes is transmitted thereto, decoding processing employing the inner code and outputting decoded data,
a storing means for storing the decoded data,
a second decoding means for applying decoding processing employing the outer code to the decoded data output from the storing means, and
a control means for controlling storage of the decoded data in the storing means, for controlling output of the decoded data from the storing means, and for suspending, while the control means causes the storing means to output first decoded data as the decoded data of a decoding result of first frame data to the second decoding means and when the first decoding means starts output of second decoded data as the decoded data of a decoding result of second frame data transmitted following the first frame data, the output of the first decoded data to the second decoding means and cause the storing means to store the second decoded data and, when the storage of the second decoded data ends, for instructing the storing means to resume the output of the first decoded data to the second decoding means.

8. A receiving system comprising:
a transmission channel decoding processing means for applying processing including error correction processing to a signal acquired via a transmission channel; and
an information source decoding processing means for applying processing for decoding transmission target data to the signal processed by the transmission channel decoding processing means, wherein
the transmission channel decoding processing means includes
a first decoding means for performing, every time frame data in which an inner code and an outer code are used as error correction codes is transmitted thereto, decoding processing employing the inner code and outputting decoded data,
a storing means for storing the decoded data,
a second decoding means for applying decoding processing employing the outer code to the decoded data output from the storing means, and
a control means for controlling storage of the decoded data in the storing means, for controlling output of the decoded data from the storing means, and for suspending, while the control means causes the storing means to output first decoded data as the decoded data of a decoding result of first frame data to the second decoding means, when the first decoding means starts output of second decoded data as the decoded data of a decoding result of second frame data transmitted following the first frame data, the output of the first decoded data to the second decoding means and cause the storing means to store the second decoded data and, when the storage of the second decoded data ends, for instructing the storing means to resume the output of the first decoded data to the second decoding means.

9. A receiving system comprising:
a transmission channel decoding processing means for applying processing including error correction processing to a signal acquired via a transmission channel; and
an output means for outputting an image or sound on the basis of the signal processed by the transmission channel decoding processing means, wherein
the transmission channel decoding processing means includes
a first decoding means for performing, every time frame data in which an inner code and an outer code are used as error correction codes is transmitted thereto, decoding processing employing the inner code and outputting decoded data,
a storing means for storing the decoded data,
a second decoding means for applying decoding processing employing the outer code to the decoded data output from the storing means, and
a control means for controlling storage of the decoded data in the storing means, for controlling output of the decoded data from the storing means, and for suspending, while the control means causes the storing means to output first decoded data as the decoded data of a decoding result of first frame data to the second decoding means and when the first decoding means starts output of second decoded data as the decoded data of a decoding result of second frame data transmitted following the first frame data, the output of the first decoded data to the second decoding means and cause the storing means to store the second decoded data and, when the storage of the second decoded data ends, for instructing the storing means to resume the output of the first decoded data to the second decoding means.

10. A receiving system comprising:
a transmission channel decoding processing means for applies processing including error correction processing to a signal acquired via a transmission channel; and
a recording means for recording the signal processed by the transmission channel decoding processing means, wherein
the transmission channel decoding processing means includes
a first decoding means for performing, every time frame data in which an inner code and an outer code are used as error correction codes is transmitted thereto, decoding processing employing the inner code and outputting decoded data,
a storing means for storing the decoded data,
a second decoding means for applying decoding processing employing the outer code to the decoded data output from the storing means, and
a control means for controlling storage of the decoded data in the storing means, for controlling output of the decoded data from the storing means, and for suspending, while the control means causes the storing means to output first decoded data as the decoded data of a decoding result of first frame data to the second decoding means and when the first decoding means starts output of second decoded data as the decoded data of a decoding result of second frame data transmitted following the first frame data, the output of the first decoded data to the second decoding means and cause the storing means to store the second decoded data and, when the storage of the second decoded data ends, for instructing the storing means to resume the output of the first decoded data to the second decoding means.

11. A receiving apparatus comprising:
a first decoding unit that performs, every time frame data in which an inner code and an outer code are used as error correction codes is transmitted thereto, decoding processing employing the inner code and outputs decoded data;
a storing unit that stores the decoded data;
a second decoding unit that applies decoding processing employing the outer code to the decoded data output from the storing unit; and
a control unit that controls storage of the decoded data in the storing unit, that controls output of the decoded data from the storing unit, and that suspends while the control unit causes the storing unit to output first decoded data as the decoded data of a decoding result of first frame data to the second decoding unit and when the first decoding unit starts output of second decoded data as the decoded data of a decoding result of second frame data transmitted following the first frame data, the output of the first decoded data to the second decoding unit and cause the storing unit to store the second decoded data and, when the storage of the second decoded data ends, that instructs the storing unit to resume the output of the first decoded data to the second decoding unit.

12. A receiving system comprising:
an acquiring unit that acquires a signal transmitted via a transmission channel; and
a transmission channel decoding processing unit that applies processing including error correction processing to the signal acquired by the acquiring unit, wherein
the transmission channel decoding processing unit includes
a first decoding unit that performs, every time frame data in which an inner code and an outer code are used as error correction codes is transmitted thereto, decoding processing employing the inner code and outputs decoded data,
a storing unit that stores the decoded data,
a second decoding unit that applies decoding processing employing the outer code to the decoded data output from the storing unit, and
a control unit that controls storage of the decoded data in the storing unit, that controls output of the decoded data from the storing unit, and that suspends, while the control unit causes the storing unit to output first decoded data as the decoded data of a decoding result of first frame data to the second decoding unit and when the first decoding unit starts output of second decoded data as the decoded data of a decoding result of second frame data transmitted following the first frame data, the output of the first decoded data to the second decoding unit and cause the storing unit to store the second decoded data and, when the storage of the second decoded data ends, that instructs the storing unit to resume the output of the first decoded data to the second decoding unit.

13. A receiving system comprising:
a transmission channel decoding processing unit that applies processing including error correction processing to a signal acquired via a transmission channel; and
an information source decoding processing unit that applies processing for decoding transmission target data to the signal processed by the transmission channel decoding processing unit, wherein
the transmission channel decoding processing unit includes
a first decoding unit that performs, every time frame data in which an inner code and an outer code are used as error correction codes is transmitted thereto, decoding processing employing the inner code and outputs decoded data,
a storing unit that stores the decoded data,
a second decoding unit that applies decoding processing employing the outer code to the decoded data output from the storing unit, and
a control unit that controls storage of the decoded data in the storing unit, that controls output of the decoded data from the storing unit, and that suspends, while the control unit causes the storing unit to output first decoded data as the decoded data of a decoding result of first frame data to the second decoding unit and when the first decoding unit starts output of second decoded data as the decoded data of a decoding result of second frame data transmitted following the first frame data, the output of the first decoded data to the second decoding unit and cause the storing unit to store the second decoded data and, when the storage of the second decoded data ends, that instructs the storing unit to resume the output of the first decoded data to the second decoding unit.

14. A receiving system comprising:
a transmission channel decoding processing unit that applies processing including error correction processing to a signal acquired via a transmission channel; and
an output unit that outputs an image or sound on the basis of the signal processed by the transmission channel decoding processing unit, wherein the transmission channel decoding processing unit includes
- a first decoding unit that performs, every time frame data in which an inner code and an outer code are used as error correction codes is transmitted thereto, decoding processing employing the inner code and outputs decoded data,
- a storing unit that stores the decoded data,
- a second decoding unit that applies decoding processing employing the outer code to the decoded data output from the storing unit, and
- a control unit that controls storage of the decoded data in the storing unit, that controls output of the decoded data from the storing unit, and that suspends, while the control unit causes the storing unit to output first decoded data as the decoded data of a decoding result of first frame data to the second decoding unit and when the first decoding unit starts output of second decoded data as the decoded data of a decoding result of second frame data transmitted following the first frame data, the output of the first decoded data to the second decoding unit and cause the storing unit to store the second decoded data and, when the storage of the second decoded data ends, that instructs the storing unit to resume the output of the first decoded data to the second decoding unit.

15. A receiving system comprising:
- a transmission channel decoding processing unit that applies processing including error correction processing to a signal acquired via a transmission channel; and
- a recording unit that records the signal processed by the transmission channel decoding processing unit, wherein the transmission channel decoding processing unit includes
- a first decoding unit that performs, every time frame data in which an inner code and an outer code are used as error correction codes is transmitted thereto, decoding processing employing the inner code and outputs decoded data,
- a storing unit that stores the decoded data,
- a second decoding unit that applies decoding processing employing the outer code to the decoded data output from the storing unit, and
- a control unit that controls storage of the decoded data in the storing unit, that controls output of the decoded data from the storing unit, and that suspends, while the control unit causes the storing unit to output first decoded data as the decoded data of a decoding result of first frame data to the second decoding unit and when the first decoding unit starts output of second decoded data as the decoded data of a decoding result of second frame data transmitted following the first frame data, the output of the first decoded data to the second decoding unit and cause the storing unit to store the second decoded data and, when the storage of the second decoded data ends, that instructs the storing unit to resume the output of the first decoded data to the second decoding unit.

* * * * *